United States Patent
Tu et al.

(10) Patent No.: US 11,222,980 B2
(45) Date of Patent: Jan. 11, 2022

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Wen-Hsien Tu, Hsinchu (TW); Wei-Fan Lee, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/516,171

(22) Filed: Jul. 18, 2019

(65) Prior Publication Data

US 2021/0020770 A1   Jan. 21, 2021

(51) Int. Cl.
*H01L 29/78* (2006.01)
*H01L 29/66* (2006.01)
(Continued)

(52) U.S. Cl.
CPC ........ *H01L 29/785* (2013.01); *H01L 21/0245* (2013.01); *H01L 21/02362* (2013.01);
(Continued)

(58) Field of Classification Search
CPC ......... H01L 21/02381; H01L 21/02392; H01L 21/02409; H01L 21/02428; H01L 21/0243;
(Continued)

(56) References Cited

U.S. PATENT DOCUMENTS 9,166,010 B2 * 10/2015 Kelly ................ H01L 29/41766
9,755,019 B1 *  9/2017 Fung ................. H01L 29/41791
(Continued)

FOREIGN PATENT DOCUMENTS

KR   10-2015-0044804 A    4/2015
KR   10-2016-0125209 A   10/2016
(Continued)

OTHER PUBLICATIONS

Peter Verheyen et al., "Strain Enhanced nMOS Using In Situ Doped Embedded Si1-xCx S/D Stressors With up to 1.5% Substitutional Carbon Content Grown Using a Novel Deposition Process," IEEE Electron Device Letters, vol. 29, No. 11, pp. 1206-1208 (Nov. 2008).
(Continued)

*Primary Examiner* — Natalia A Gondarenko
(74) *Attorney, Agent, or Firm* — McDermott Will & Emery LLP

(57) ABSTRACT

A semiconductor device includes a fin structure protruding from a first isolation insulating layer provided over a substrate, a gate dielectric layer disposed over a channel region of the fin structure, a gate electrode layer disposed over the gate dielectric layer, a base semiconductor epitaxial layer disposed over a source/drain region of the fin structure, and a cap semiconductor epitaxial layer disposed over the base semiconductor epitaxial layer. The cap semiconductor epitaxial layer has a different lattice constant than the base semiconductor epitaxial layer, and a surface roughness of the cap semiconductor epitaxial layer along a source-to-drain direction is greater than zero and smaller than a surface roughness of the base semiconductor epitaxial layer along the source-to-drain direction.

20 Claims, 19 Drawing Sheets

(51) Int. Cl.
*H01L 21/02* (2006.01)
*H01L 21/768* (2006.01)

(52) U.S. Cl.
CPC .. *H01L 21/02447* (2013.01); *H01L 21/76831* (2013.01); *H01L 29/66545* (2013.01); *H01L 29/66795* (2013.01)

(58) Field of Classification Search
CPC ....... H01L 21/02433; H01L 21/823864; H01L 21/02452; H01L 21/02461; H01L 21/0251; H01L 21/02516; H01L 21/02535; H01L 21/0274; H01L 21/042; H01L 21/2018; H01L 21/302; H01L 21/3043; H01L 21/3101; H01L 21/31053; H01L 21/0245; H01L 21/02447; H01L 21/02362; H01L 21/76; H01L 21/7602; H01L 21/762; H01L 21/823871; H01L 21/76205; H01L 21/76283; H01L 21/76831; H01L 21/7684; H01L 21/823412; H01L 21/823418; H01L 21/823425; H01L 21/82385; H01L 21/823431; H01L 21/823437; H01L 21/82345; H01L 21/823468; H01L 21/823481; H01L 21/823814; H01L 21/823821; H01L 29/0688; H01L 29/0865–0869; H01L 29/0882–0886; H01L 29/41758; H01L 29/785; H01L 29/7851; H01L 29/41766; H01L 29/42783; H01L 29/66545; H01L 29/66795; H01L 29/66636; H01L 29/66696; H01L 29/66727; H01L 29/7848

USPC .......................... 257/288, 401, 347, 336, 192
See application file for complete search history.

(56) References Cited

U.S. PATENT DOCUMENTS

| | | | |
|---|---|---|---|
| 9,837,500 B2* | 12/2017 | Lee | H01L 29/41791 |
| 9,953,875 B1* | 4/2018 | Cheng | H01L 29/0847 |
| 2014/0197456 A1 | 7/2014 | Wang et al. | |
| 2016/0027918 A1* | 1/2016 | Kim | H01L 29/165 257/401 |
| 2016/0049338 A1 | 2/2016 | Ching et al. | |
| 2016/0315160 A1 | 10/2016 | Lee et al. | |
| 2016/0372598 A1* | 12/2016 | Wang | H01L 29/7848 |
| 2017/0025313 A1* | 1/2017 | Ching | H01L 27/092 |
| 2018/0175172 A1 | 6/2018 | Chang et al. | |
| 2019/0348415 A1* | 11/2019 | Sung | H01L 29/165 |
| 2020/0227321 A1* | 7/2020 | Kim | H01L 21/823481 |
| 2020/0312981 A1* | 10/2020 | Bomberger | H01L 29/7853 |

FOREIGN PATENT DOCUMENTS

| | | |
|---|---|---|
| KR | 10-2018-0069701 A | 6/2018 |
| TW | 201727899 A | 8/2017 |
| TW | 201824373 A | 7/2018 |
| TW | 201834078 A | 9/2018 |

OTHER PUBLICATIONS

S. Barraud et al.,"Vertically Stacked-NanoWires MOSFETs in a Replacement Metal Gate Process with Inner Spacer and SiGe Source/Drain," IEDM Tech. Dig., pp. 464-467, Dec. 2016.

* cited by examiner

METHOD OF MANUFACTURING A SEMICONDUCTOR DEVICE AND A SEMICONDUCTOR DEVICE

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (FinFET) and a gate-all-around (GAA) FET. In a FinFET, a gate electrode layer is adjacent to three side surfaces of a channel region with a gate dielectric layer interposed therebetween. Because the gate structure surrounds (wraps) the fin on three surfaces, the transistor essentially has three gates controlling the current through the fin or channel region. The current driving capacity of the FinFET is generally determined by the number of the fins, the fin width and the fin height at the channel region.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
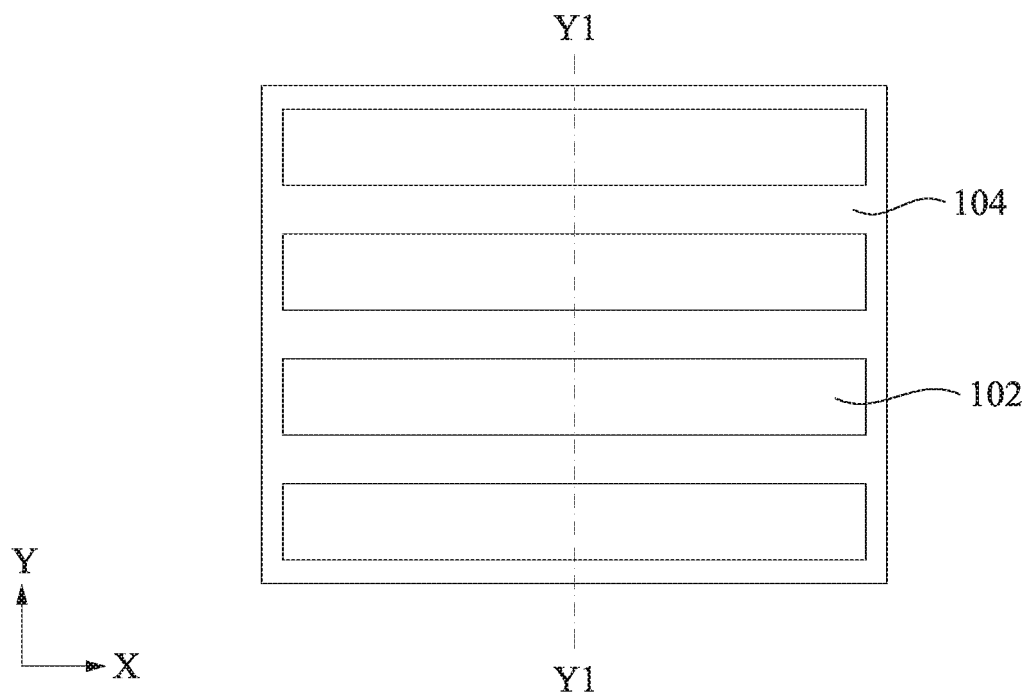
FIGS. 1A and 1B show one of the various stages of sequential processes for manufacturing a semiconductor device having a FinFET according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, processes, dimensions and/or configurations of one embodiment can be employed in other embodiments unless otherwise described, and the detailed description thereof may be omitted.

In the present disclosure, a source/drain structure of a FinFET includes a base epitaxial layer and a cap epitaxial layer that induces appropriate stress to the base epitaxial layer. For a p-type FET, the lattice constant of the cap epitaxial layer is smaller than the lattice constant of the base epitaxial layer to induce compressive stress in the base epitaxial layer. For an n-type FET, the lattice constant of the cap epitaxial layer is greater than the lattice constant of the base epitaxial layer to induce tensile stress in the base epitaxial layer. Further, the cap epitaxial layer has a smoother surface than the base epitaxial layer and thus the source/drain structure of the present disclosure can improve interfacial characteristics (e.g., contact resistance) with a metal contact.

FIGS. 1A-9B show sequential processes for manufacturing a semiconductor device having a FinFET according to an embodiment of the present disclosure. It is understood that additional operations can be provided before, during, and after the processes shown by FIGS. 1A-9B, and some of the operations described below can be replaced or eliminated, for additional embodiments of the method. The order of the operations/processes may be interchangeable. In FIGS. 1A-9B, the "A" figures (FIG. 1A, 2A, . . . ) show plan views (views from the above) and the "B" figures (FIGS. 1B, 2B, . . . ) show cross sectional views.

Figure 1B:
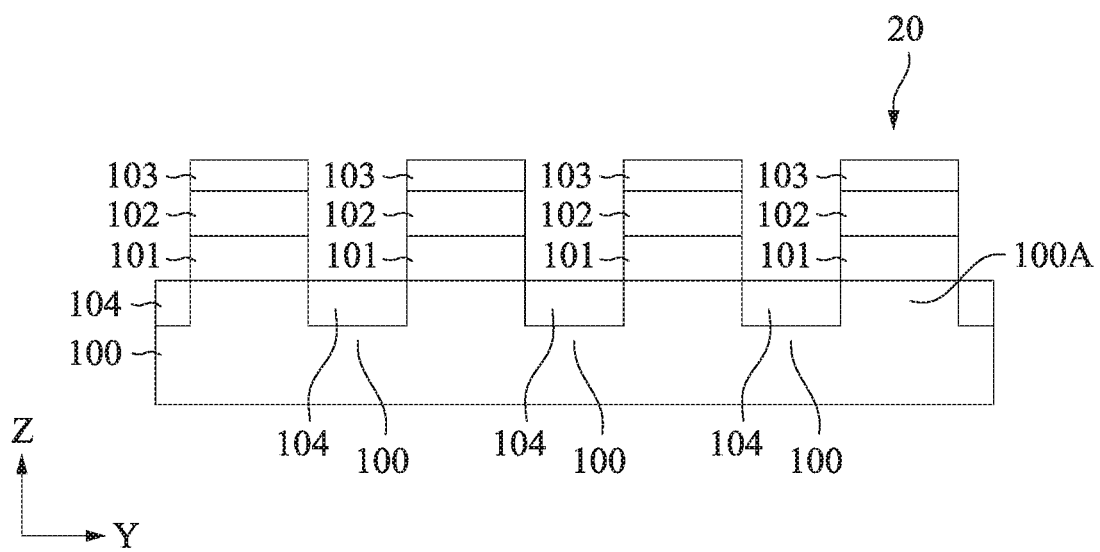

FIGS. 1A and 1B show one of the various stages of sequential processes for manufacturing a semiconductor device having a FinFET according to an embodiment of the present disclosure. FIG. 1B is a cross sectional view corresponding to line Y1-Y1 of FIG. 1A.

As shown in FIGS. 1A and 1B, fin structures 20 are formed over a substrate 100. In one embodiment, substrate 100 includes a single crystalline semiconductor layer on at least its surface portion. The substrate 100 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 100 is made of Si.

In some embodiments, the fin structure 20 includes a fin bottom 100A, which is a protruding part of the substrate 100, a buffer semiconductor layer 101 formed on the fin bottom 100A, a channel semiconductor layer 102 formed on the buffer semiconductor layer 101, and a hard mask layer 103 formed on the channel semiconductor layer 102.

The buffer semiconductor layer 101 includes one or more semiconductor layers having different compositions in some embodiments, and can serve to gradually or step-wisely change the lattice constant from that of the substrate 100 to that of the channel semiconductor layer 102. The buffer semiconductor layer 101 can be formed from epitaxially grown single crystalline semiconductor materials such as, but not limited to Si, Ge, GeSn, SiGe, SiGeSn, GaAs, InSb, GaP, GaSb, InAlAs, InGaAs, GaSbP, GaAsSb, GaN, GaP, and InP. In certain embodiments, the buffer layer 101 includes $Si_{1-x}Ge_x$, where $0<x<1.0$. In other embodiments, the buffer layer 101 includes $Si_{1-x}Ge_x$, where $0.2<x<0.5$.

The channel semiconductor layer 102 includes one or more semiconductor layers in some embodiments and can be formed from epitaxially grown single crystalline semiconductor materials such as, but not limited to Si, Ge, GeSn, SiGe, SiGeSn, GaAs, InSb, GaP, GaSb, InAlAs, InGaAs, GaSbP, GaAsSb, GaN, GaP, and InP. In certain embodiments, the channel layer 102 includes $Si_{1-y}Ge_y$, where $0<y\leq1.0$. In other embodiments, the channel semiconductor layer 102 includes $Si_{1-y}Ge_y$, where $0.3<y\leq1.0$. In some embodiments, $x<y$. When the substrate, the buffer semiconductor layer and the channel semiconductor layer includes Si and Ge and/or Sn, an amount of Ge and/or Sn in the upper layer is greater than an amount of Ge and/or Sn in the lower layer. The substrate 100 may include various regions that have been suitably doped with impurities (e.g., p-type or n-type conductivity).

In some embodiments, the thickness of the buffer semiconductor layer 101 is in a range from about 10 nm to about 200 nm, and is in a range from about 20 nm to about 100 nm in other embodiments. In some embodiments, the thickness of the channel semiconductor layer 102 is in a range from about 20 nm to about 200 nm, and is in a range from about 50 nm to about 100 nm in other embodiments.

The hard mask layer 103 is used to pattern the fin structure 20 and includes one or more dielectric material layers.

The fin structure 20 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a dummy layer is formed over a substrate and patterned using a photolithography process. Spacers are formed alongside the patterned dummy layer using a self-aligned process. The dummy layer is then removed, and the remaining spacers may then be used to pattern the fins.

In other embodiments, the fin structures can be patterned by using the hard mask layer (pattern) 103 as an etching mask. In some embodiments, the hard mask layer 103 includes a first mask layer and a second mask layer disposed on the first mask layer. The first mask layer is a pad oxide layer made of a silicon oxide, which can be formed by a thermal oxidation. The second mask layer is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The deposited hard mask layer is patterned into a hard mask pattern by using patterning operations including photo-lithography and etching. Then, the channel semiconductor layer 102, the buffer semiconductor layer 101 and the substrate 100 are patterned by using the hard mask pattern into fin structures 20 extending in the X direction. In FIGS. 1A and 1B, four fin structures 20 are arranged in the Y direction. But the number of the fin structures is not limited to four, and may be as small as one or two, or three or more. In some embodiments, the number of fin structures is up to 20. In some embodiments, one or more dummy fin structures are formed on both sides of the fin structures to improve pattern fidelity in the patterning operations.

The width of the upper portion of the fin structure 20 along the Y direction is in a range from about 5 nm to about 40 nm in some embodiments, and is in a range from about 10 nm to about 20 nm in other embodiments.

Further, as shown in FIGS. 1A and 1B, a first isolation insulating layer 104, such as a shallow trench isolation (STI), is formed. After the fin structures 20 are formed, a first insulating material layer including one or more layers of insulating material is formed over the substrate 100 so that the fin structures 20 are fully embedded in the first insulating material layer. The insulating material for the first insulating material layer may include silicon oxide, silicon nitride, silicon oxynitride (SiON), SiCN, fluorine-doped silicate glass (FSG), or a low-K dielectric material, formed by LPCVD (low pressure chemical vapor deposition), plasma-CVD or flowable CVD or any other suitable film formation methods. In some embodiments, the first insulating material layer is made of silicon oxide. An anneal operation may be performed after the formation of the first insulating material layer. Then, a planarization operation, such as a chemical mechanical polishing (CMP) method and/or an etch-back method, is performed such that the hard mask layer 103 is exposed.

Then, as shown in FIG. 1B, the first insulating material layer is recessed, by etching, to form the first isolation insulating layer 104 so that the upper portions of the fin structures 20, for example, the buffer semiconductor layer 101 and the channel semiconductor layer 102, are exposed. In some embodiments, part of or all of the buffer semiconductor layer 101 is embedded in the isolation insulating layer 104. In some embodiments, a bottom part of the channel semiconductor layer 102 is embedded in the isolation insulating layer 104. In some embodiments, an upper part of the fin bottom structure 100A protrudes from the isolation insulating layer 104.

In some embodiments, one or more fin liner layers (not shown) are formed over the fin structures before forming the first insulating material layer. The fin liner layer may be made of SiN or a silicon nitride-based material (e.g., SiON or SiCN).

Figure 2A:
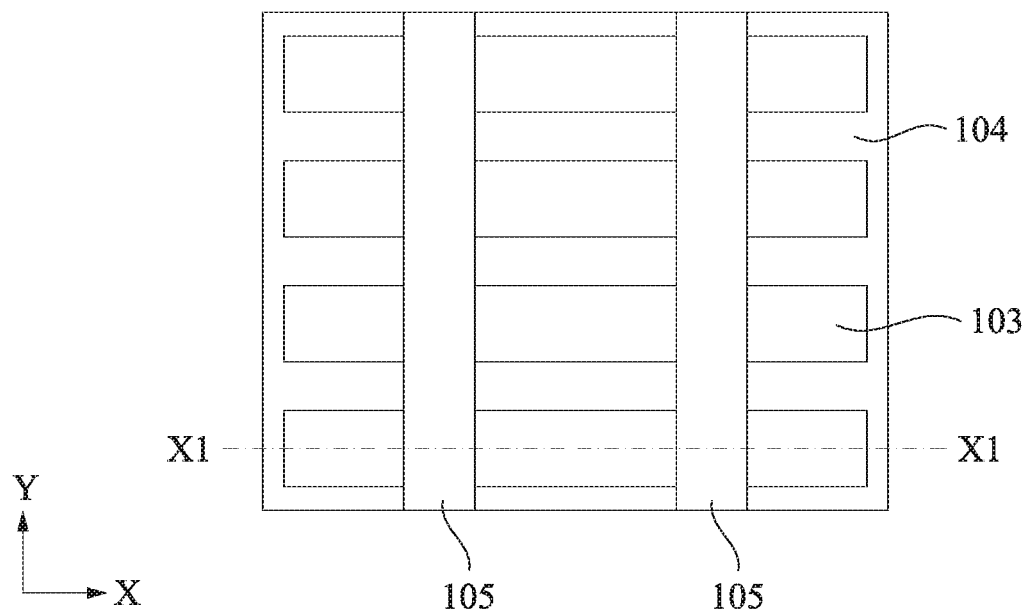
FIGS. 2A and 2B show one of the various stages of sequential processes for manufacturing a semiconductor device having a FinFET according to an embodiment of the present disclosure.
Figure 2B:
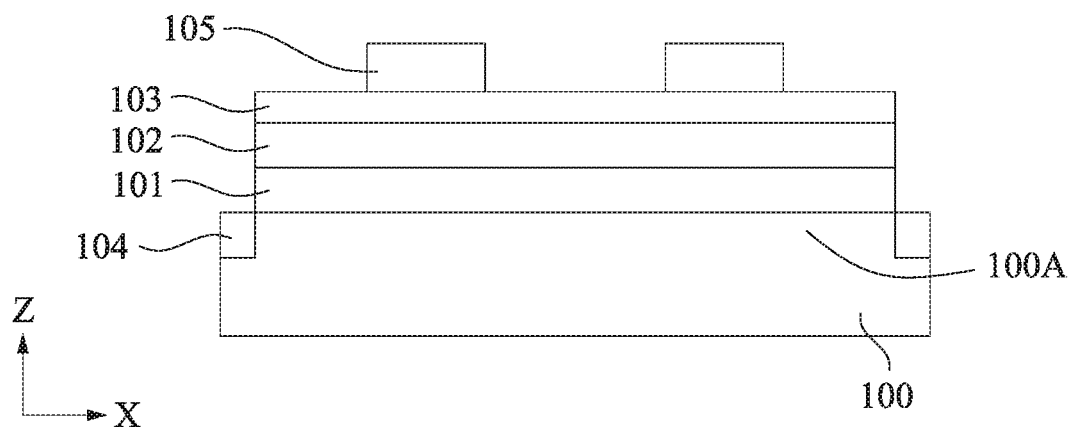

FIGS. 2A and 2B show one of the various stages of sequential processes for manufacturing a semiconductor device having a FinFET according to an embodiment of the present disclosure. FIG. 2B is a cross sectional view corresponding to line X1-X1 of FIG. 2A.

After the first isolation insulating layer 104 is formed, a dummy gate structure 105 is formed, as shown in FIGS. 2A and 2B. The dummy gate structure 105 includes a dummy gate dielectric layer and a dummy gate electrode layer. The dummy gate dielectric layer includes one or more layers of insulating material, such as a silicon oxide-based material. In one embodiment, silicon oxide formed by CVD is used. The thickness of the dummy gate dielectric layer is in a range from about 1 nm to about 5 nm in some embodiments. In other embodiments, no dummy gate dielectric layer is formed, and in such a case, the hard mask layer 103 can function as a dummy gate dielectric layer.

The dummy gate structure 105 is formed by first blanket depositing the dummy gate dielectric layer, if used, over the exposed fin structures 20 and the upper surface of the first isolation insulating layer 104. A dummy gate electrode layer is then blanket deposited on the dummy gate dielectric layer, such that the fin structures are fully embedded in the dummy gate electrode layer. The dummy gate electrode layer includes silicon such as polycrystalline silicon (polysilicon) or amorphous silicon. In some embodiments, the dummy gate electrode layer is made of polysilicon. The thickness of the dummy gate electrode layer is in a range from about 100 nm to about 200 nm in some embodiments. In some embodiments, the dummy gate electrode layer is subjected to a planarization operation. The dummy gate dielectric layer and the dummy gate electrode layer are deposited using CVD, including LPCVD and PECVD, PVD, ALD, or other suitable process. Subsequently, a mask layer is formed over the dummy gate electrode layer. The mask layer can be a resist pattern or a hard mask pattern.

Next, a patterning operation is performed on the mask layer and dummy gate electrode layer is patterned into the dummy gate structures 105, as shown in FIGS. 2A and 2B. By patterning the dummy gate structures, the upper portions of the fin structures 20, which are to be source/drain regions, are partially exposed on opposite sides of the dummy gate structures 105, as shown in FIG. 2B. In this disclosure, a source and a drain are interchangeably used and the structures thereof are substantially the same. In FIGS. 2A and 2B, two dummy gate structures 105 are formed on four fin structures 20. However, the layout is not limited to FIGS. 2A and 2B, and the number of dummy gate structures can be one or more than two for the same fin structure(s).

The width of the dummy gate structure 105 in the X direction is in a range from about 5 nm to about 30 nm in some embodiments, and is in a range from about 7 nm to about 15 nm in other embodiments.

Figure 3A:
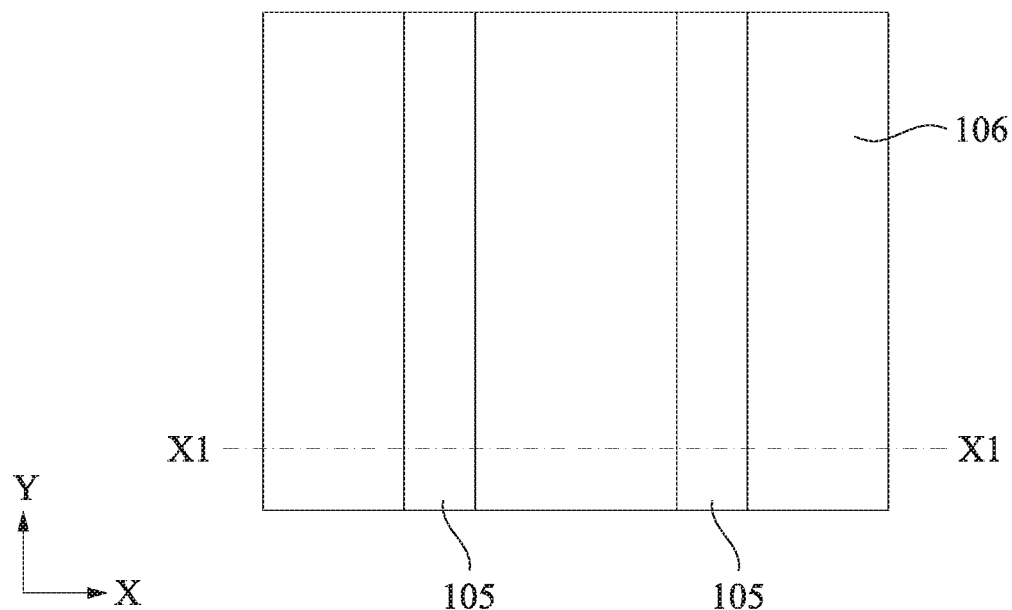
FIGS. 3A and 3B show one of the various stages of sequential processes for manufacturing a semiconductor device having a FinFET according to an embodiment of the present disclosure.
Figure 3B:
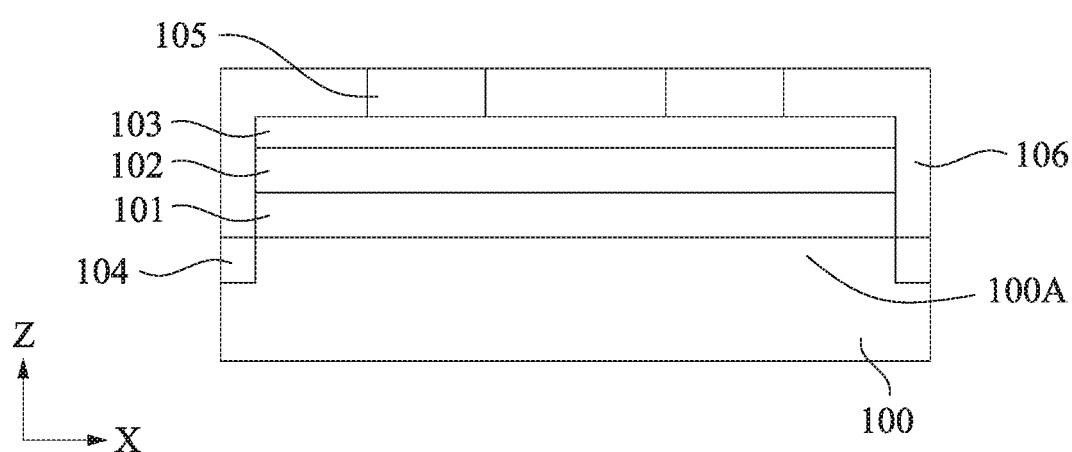

FIGS. 3A and 3B show one of the various stages of sequential processes for manufacturing a semiconductor device having a FinFET according to an embodiment of the present disclosure. FIG. 3B is a cross sectional view corresponding to line X1-X1 of FIG. 3A.

Further, a second isolation insulating layer 106 including one or more layers of insulating material is formed over the first isolation insulating layer 104 so that the fin structures 20 and the dummy gate structure 105 are fully embedded in the second insulating material layer. The second isolation insulating layer 106 covers end faces of the fin structure 20 and defines a source/drain space in which a source/drain epitaxial layer is formed. The insulating material for the second isolation insulating layer 106 is different from that of the first isolation insulating layer 104, and includes silicon oxide, silicon nitride, silicon oxynitride (SiON), SiOCN, SiOC, SiCN, fluorine-doped silicate glass (FSG), or a low-k dielectric material, formed by LPCVD (low pressure chemical vapor deposition), plasma-CVD, atomic layer deposition (ALD) or flowable CVD, or any other suitable film formation methods. In some embodiments, the second isolation insulating layer 106 includes SiOC or SiOCN. An anneal operation may be performed after the formation of the second isolation insulating layer. Then, a planarization operation, such as a chemical mechanical polishing (CMP) method and/or an etch-back method, is performed such that the upper surface of the dummy gate structure 105 is exposed from the second isolation insulating layer 106 as shown in FIGS. 3A and 3B.

Figure 4A:
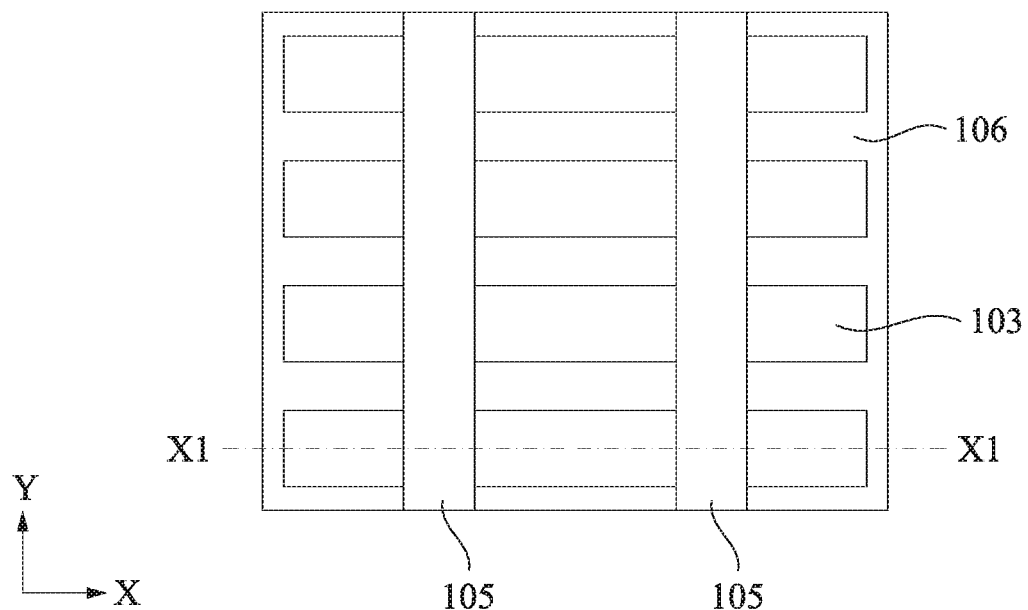
FIGS. 4A and 4B show one of the various stages of sequential processes for manufacturing a semiconductor device having a FinFET according to an embodiment of the present disclosure.
Figure 4B:
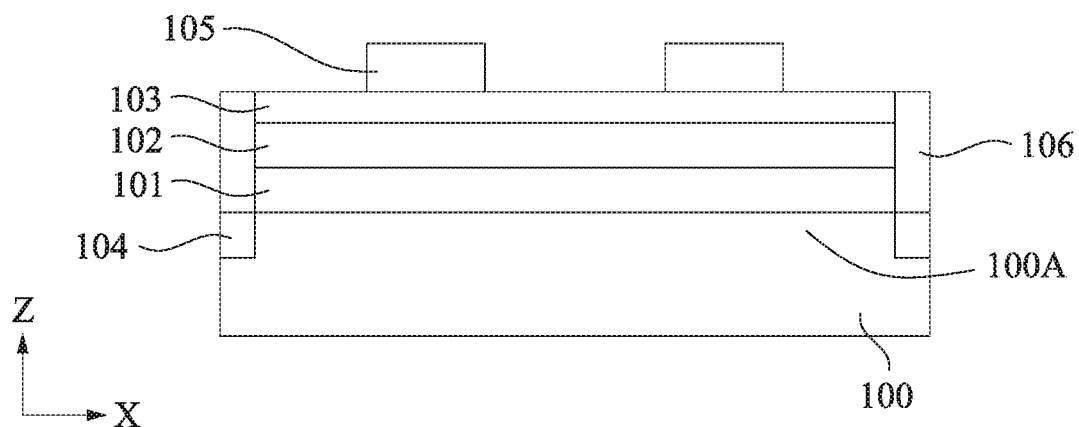

FIGS. 4A and 4B show one of the various stages of sequential processes for manufacturing a semiconductor device having a FinFET according to an embodiment of the present disclosure. FIG. 4B is a cross sectional view corresponding to line X1-X1 of FIG. 4A.

Then, as shown in FIGS. 4A and 4B, the second isolation insulating layer 106 is recessed, by etching, to expose the hard mask layer 103. In some embodiments, the upper surface of the second isolation insulating layer 106 is at the same level as the upper surface of the hard mask layer 103. In other embodiments, the upper surface of the second isolation insulating layer 106 is below the upper surface of the hard mask layer 103, and above the upper surface of the channel semiconductor layer 102. In other embodiments, the second isolation insulating layer 106 is further recessed to fully expose the side face of the channel semiconductor layer 102. In certain embodiments, the second isolation insulating layer 106 is further recessed to expose a part of the side face of the buffer semiconductor layer 101.

Figure 5A:
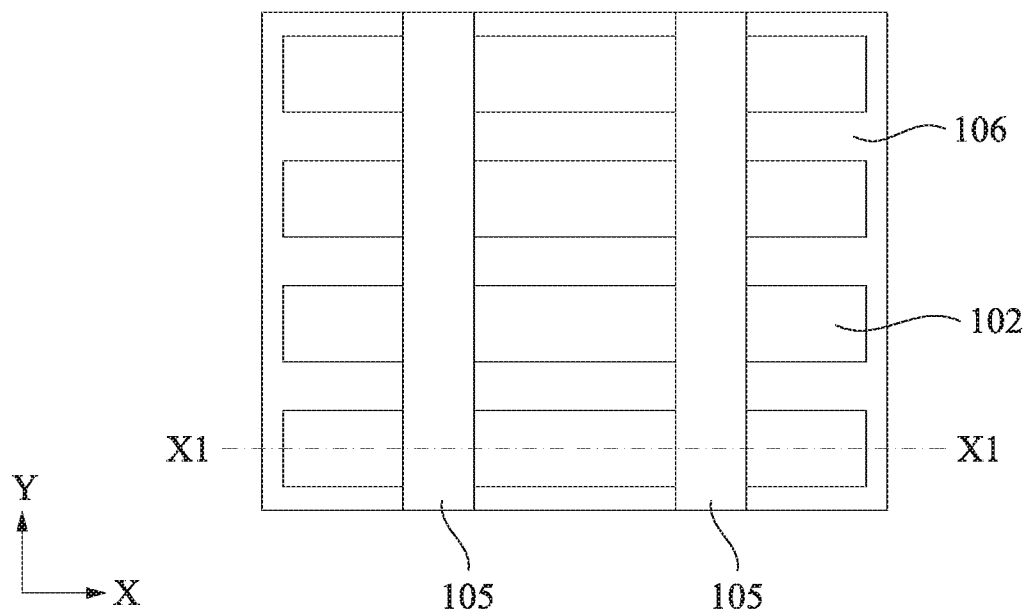
FIGS. 5A and 5B show one of the various stages of sequential processes for manufacturing a semiconductor device having a FinFET according to an embodiment of the present disclosure.
Figure 5B:
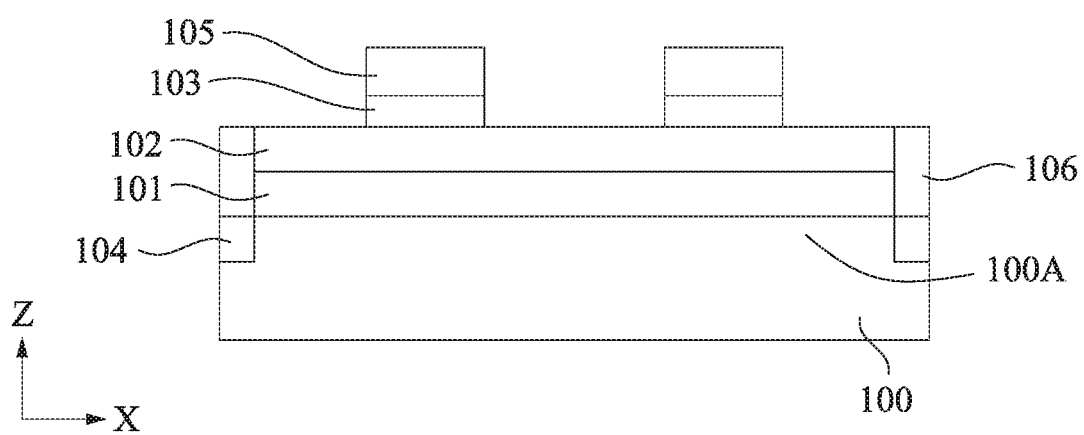

FIGS. 5A and 5B show one of the various stages of sequential processes for manufacturing a semiconductor device having a FinFET according to an embodiment of the present disclosure. FIG. 5B is a cross sectional view corresponding to line X1-X1 of FIG. 5A.

After the second isolation insulating layer 106 is recessed, the hard mask layer 103 is patterned by etching using the dummy gate structure 105 as an etching mask, thereby the channel semiconductor layer 102 is exposed, as shown in FIGS. 5A and 5B. A part of the second isolation insulating layer 106 is also etched. In some embodiments, the second isolation insulating layer 106 is etched equal to or below the upper surface of the channel semiconductor layer 102.

Figure 6A:
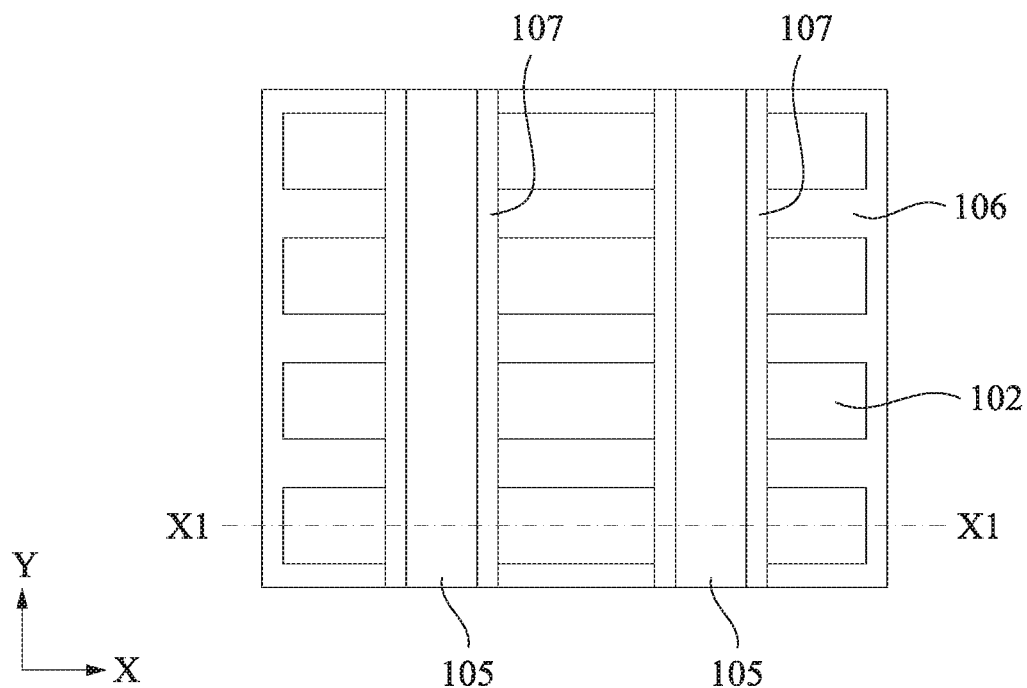
FIGS. 6A and 6B show one of the various stages of sequential processes for manufacturing a semiconductor device having a FinFET according to an embodiment of the present disclosure.
Figure 6B:
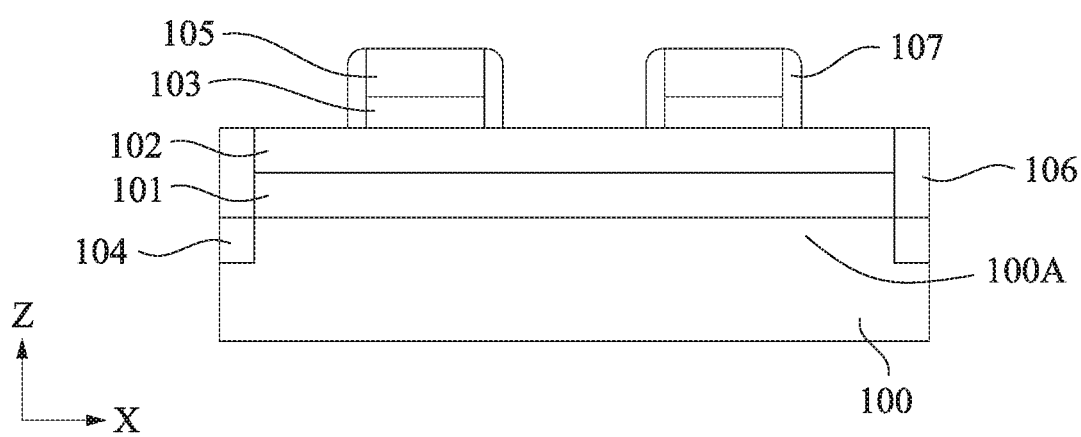

FIGS. 6A and 6B show one of the various stages of sequential processes for manufacturing a semiconductor device having a FinFET according to an embodiment of the present disclosure. FIG. 6B is a cross sectional view corresponding to line X1-X1 of FIG. 6A.

After the hard mask layer 103 is patterned, a blanket layer of an insulating material for sidewall spacers 107 is conformally formed by using CVD or other suitable methods. The blanket layer is deposited in a conformal manner so that it is formed to have substantially equal thicknesses on vertical surfaces, such as the sidewalls, horizontal surfaces, and the top of the dummy gate structures. In some embodiments, the blanket layer is deposited to a thickness in a range from about 2 nm to about 20 nm. In some embodiments, the insulating material of the blanket layer is different from the materials of the second isolation insulating layer 106, and is made of one or more of silicon oxide, silicon nitride, SiON, SiOC, SiOCN or SiCN and any other suitable dielectric material. A porous material or an organic material can be used for the sidewall spacers 107. In some embodiments, two or more layers (e.g., 3 or 4 layers) of dielectric materials are formed. In some embodiments, the blanket layer (sidewall spacers 107) is made of non-porous or porous SiOC. The sidewall spacers 107 are formed on opposite sidewalls of the dummy gate structure 105 and the hard mask layer 103, by anisotropic etching, as shown in FIGS. 6A and 6B.

Figure 7A:
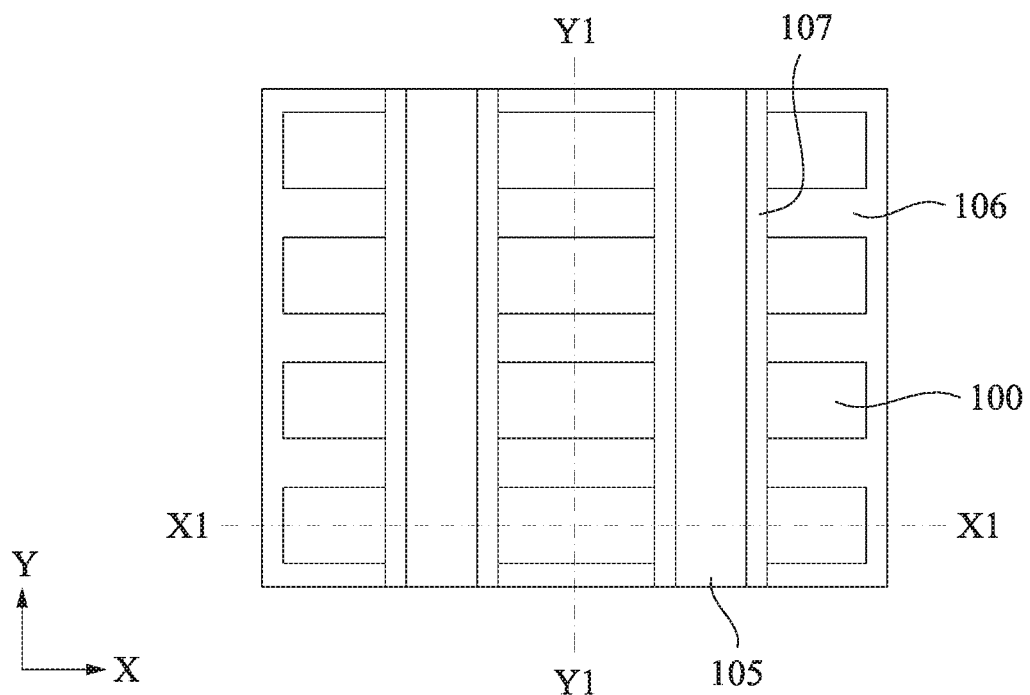
FIGS. 7A, 7B and 7C show one of the various stages of sequential processes for manufacturing a semiconductor device having a FinFET according to an embodiment of the present disclosure.
Figure 7B:
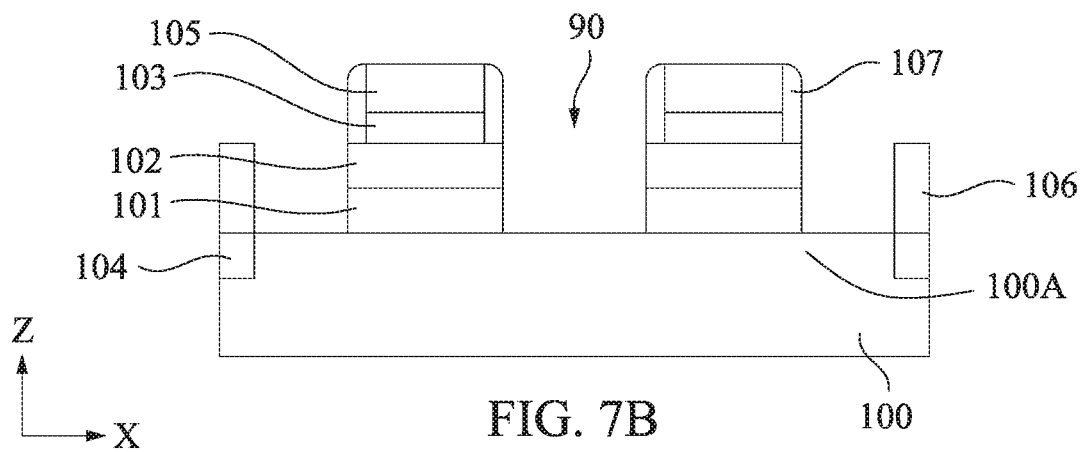
Figure 7C:
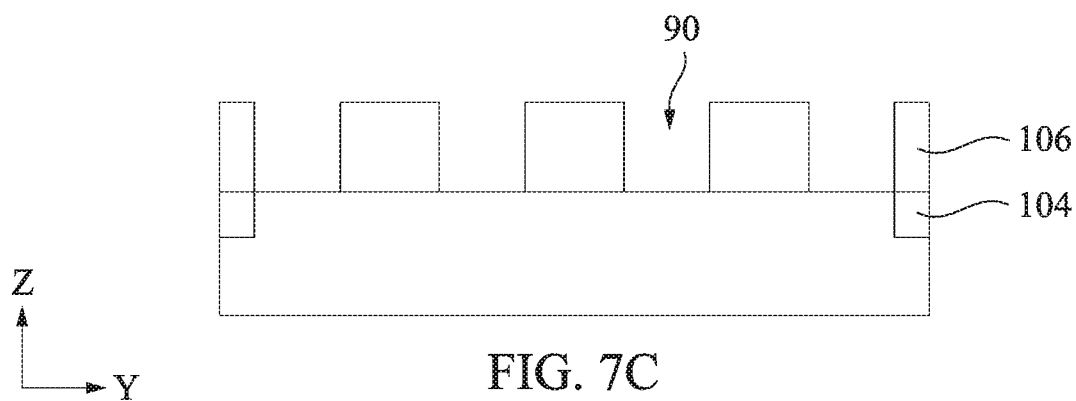

FIGS. 7A-7C show one of the various stages of sequential processes for manufacturing a semiconductor device having a FinFET according to an embodiment of the present disclosure. FIG. 7B is a cross sectional view corresponding to line X1-X1 of FIG. 7A, and FIG. 7C is a cross sectional view corresponding to line Y1-Y1 of FIG. 7A.

After the sidewall spacers 107 are formed, the source/drain regions of the fin structure, not covered by the dummy gate structures 105 and the sidewall spacers 107 are recessed down to the fin bottom structure 100A to form a trench 90 bounded by the second isolation insulating layer 106, the channel semiconductor layer 102, the buffer semiconductor layer 101 and the fin bottom structure 100A. In some embodiments, a part of the source/drain region of the buffer semiconductor layer 101 remains and the fin bottom structure 100A is not exposed. In certain embodiments, only the channel semiconductor layer 102 is etched, and the buffer semiconductor layer 101 is not etched.

Figure 8A:
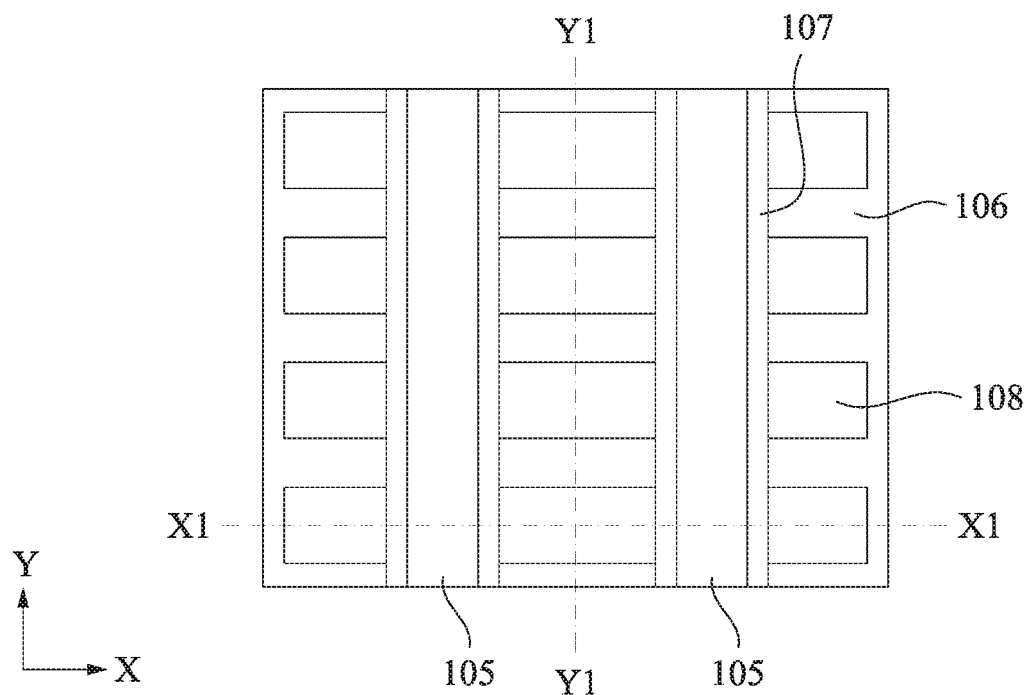
FIGS. 8A, 8B, 8C, 8D and 8E show one of the various stages of sequential processes for manufacturing a semiconductor device having a FinFET according to an embodiment of the present disclosure.
Figure 8B:
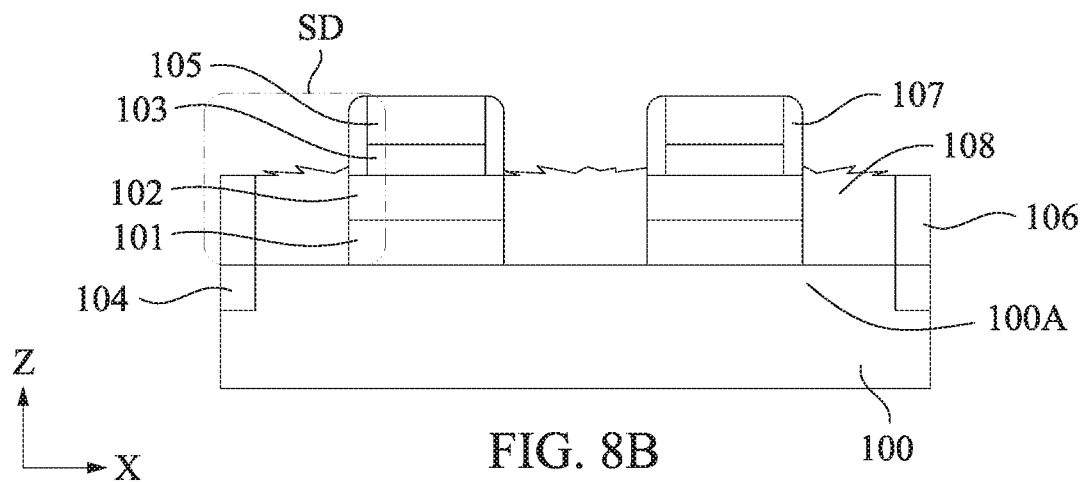
Figure 8C:
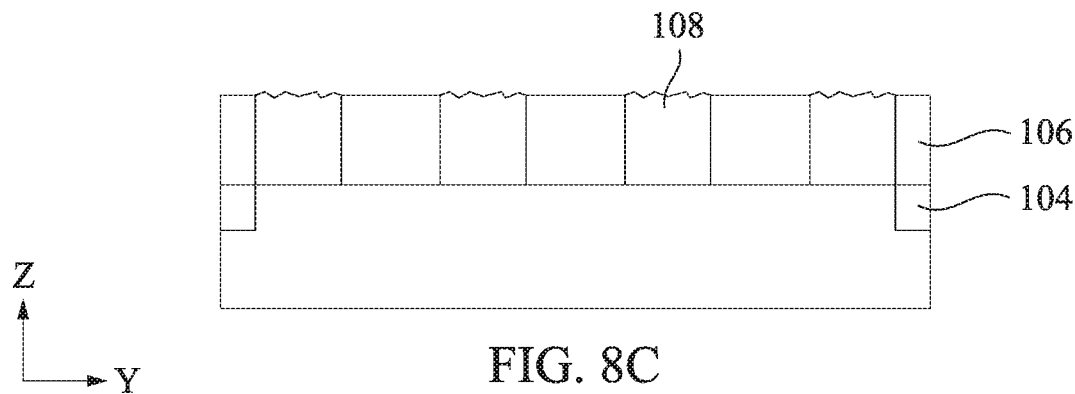
Figure 8D:
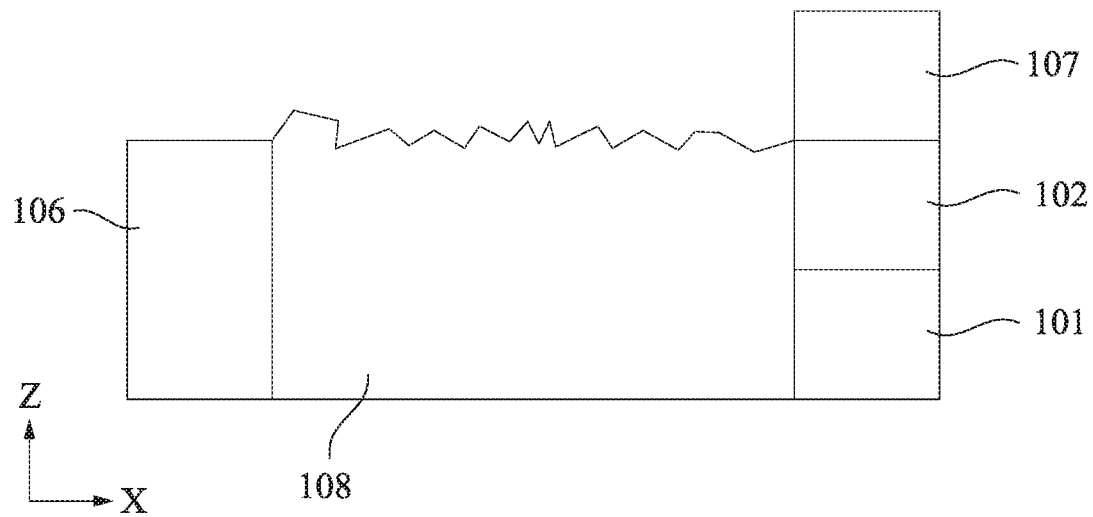
Figure 8E:
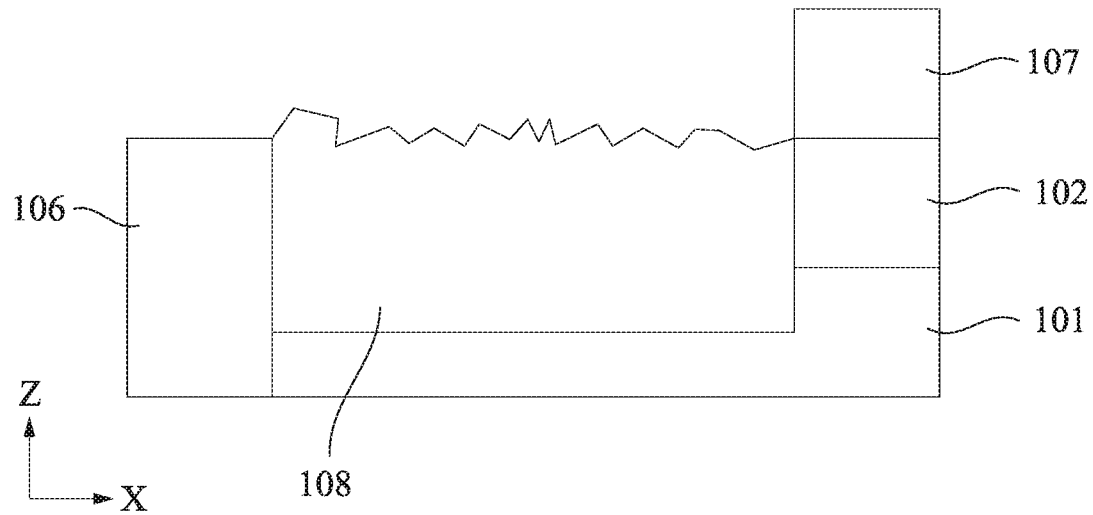

FIGS. 8A-8E show one of the various stages of sequential processes for manufacturing a semiconductor device having a FinFET according to an embodiment of the present disclosure. FIG. 8B is a cross sectional view corresponding to line X1-X1 of FIG. 8A, FIG. 8C is a cross sectional view corresponding to line Y1-Y1 of FIG. 8A and FIGS. 8D and 8E are enlarged views of area SD of FIG. 8B.

Then, a base source/drain epitaxial layer 108 is formed in the trench. The base source/drain epitaxial layer 108 includes one or more epitaxially formed semiconductor layers. The base semiconductor epitaxial layer 108 is in contact with the buffer semiconductor layer 101 and the channel semiconductor layer 102 in some embodiments. In some embodiments, the second isolation insulating layer 106 is in contact with the base semiconductor epitaxial layer 108. In some embodiments, the first isolation insulating layer 104 is not in contact with the base semiconductor epitaxial layer 108.

For an n-type FET, one or more of Si, SiP, SiC and SiCP are used as the base source/drain epitaxial layer 108. When two or more SiP layers are used, the concentrations of P are different from each other. In some embodiments, the concentration of P is higher in the later formed layer than the earlier formed layer.

For a p-type FET, one or more of SiGe, Ge, Sn, GeSn and SiGeSn are used as the base source/drain epitaxial layer 108. In some embodiments, boron (B) is doped in the base source/drain epitaxial layer 108. When two or more SiGe layers are used, the concentrations of Ge are different from each other. In some embodiments, the concentration of Ge is higher in the later formed layer than the earlier formed layer.

As shown in FIGS. 8B and 8C, the upper surface of the base source/drain epitaxial layer 108 is rough or uneven. The surface roughness Ra measured along the X direction (source-to-drain direction) at a center region is in a range from about 2 nm to about 10 nm in some embodiments. FIG. 8E shows the case where the bottom of the buffer semiconductor layer 101 remains in the etched trench. In some embodiments, the average height of the base source/drain epitaxial layer 108 is located above the level of the upper surface of the channel semiconductor layer 102. In other embodiments, the average height of the base source/drain epitaxial layer 108 is located equal to or below the level of the upper surface of the channel semiconductor layer 102.

The base source/drain epitaxial layer 108 is selectively formed in the trench 90 by an epitaxial growth method using CVD, ALD, molecular beam epitaxy (MBE) or other suitable methods. As shown in FIGS. 8B and 8C, the base source/drain epitaxial layer 108 is confined in the trench 90.

Figure 9A:
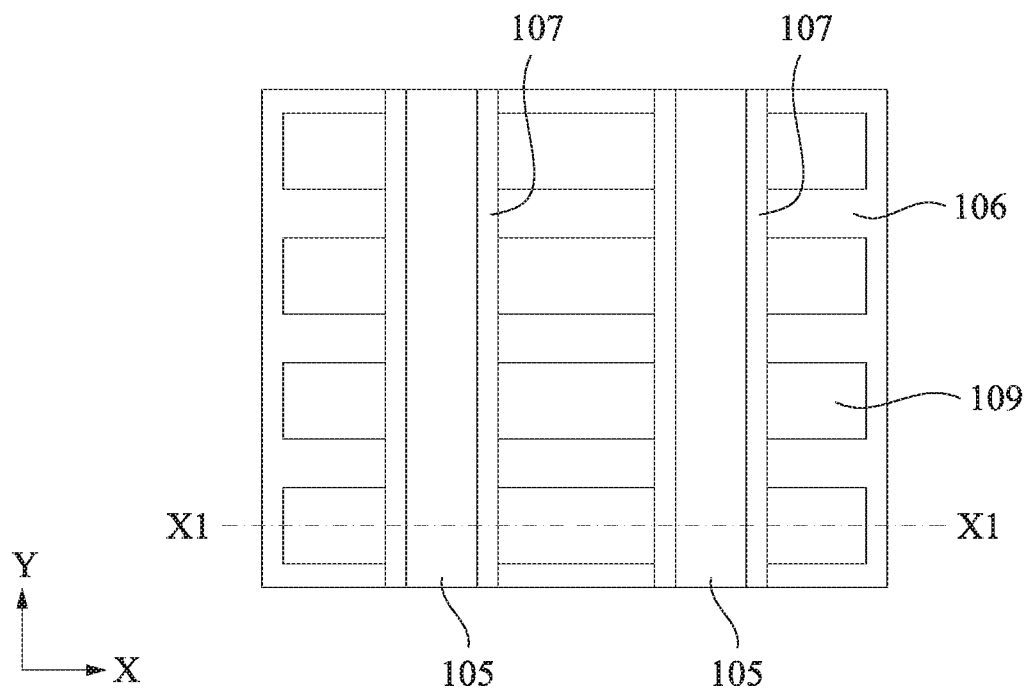
FIGS. 9A, 9B, 9C and 9D show one of the various stages of sequential processes for manufacturing a semiconductor device having a FinFET according to an embodiment of the present disclosure.
Figure 9B:
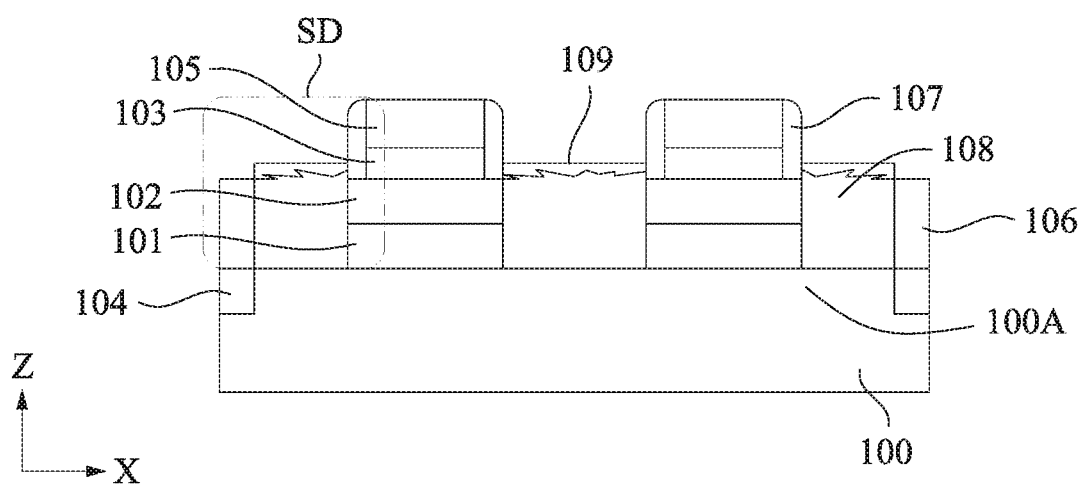
Figure 9C:
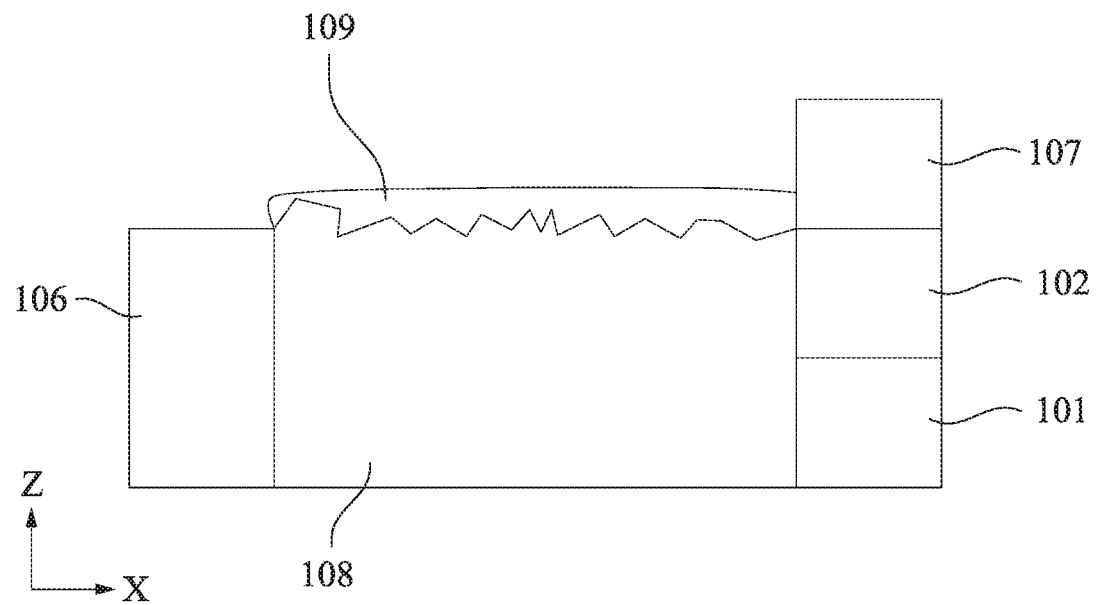
Figure 9D:
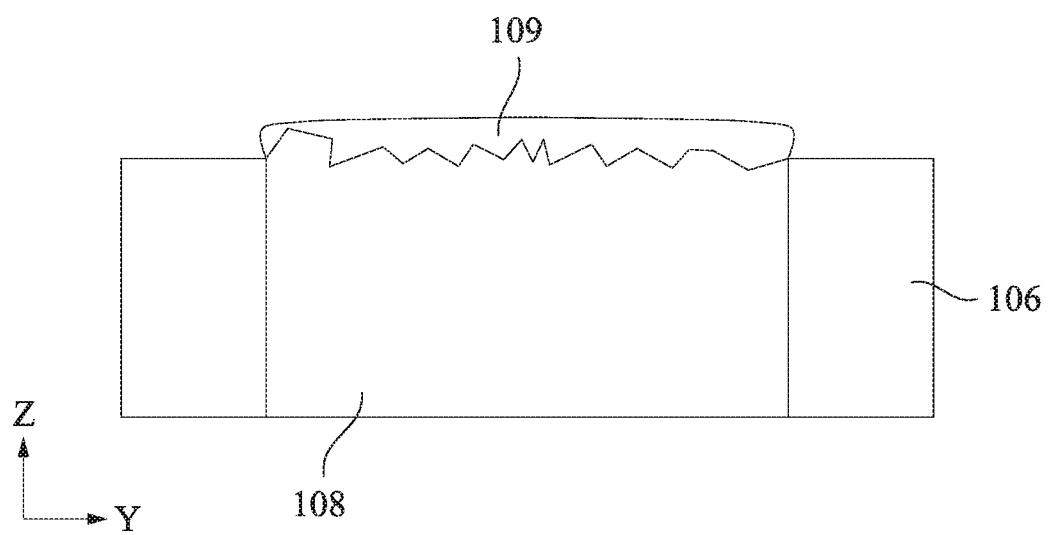

FIGS. 9A, 9B and 9C show one of the various stages of sequential processes for manufacturing a semiconductor device having a FinFET according to an embodiment of the present disclosure. FIG. 9B is a cross sectional view corresponding to line X1-X1 of FIG. 9A, and FIGS. 9C and 9D are enlarged views of area SD of FIG. 9B. FIG. 9C is a cross sectional view along the X direction and FIG. 9D is a cross sectional view along the Y direction.

After the base source/drain epitaxial layer 108 is formed, a cap source/drain epitaxial layer 109 is formed on the base source/drain epitaxial layer 108, as shown in FIGS. 9A-9D.

For an n-type FET, the lattice constant of the cap source/drain epitaxial layer 109 is greater than the lattice constant of the base source/drain epitaxial layer 108 to induce tensile stress in the base source/drain epitaxial layer 108. When the base source/drain epitaxial layer 108 is SiP, SiC and/or SiCP, the cap source/drain epitaxial layer 109 includes one or more of Si, SiGe, Ge, Sn and GeSn, in some embodiments. In certain embodiments, SiGe is used as the cap source/drain epitaxial layer 109 for an n-type FET.

For a p-type FET, the lattice constant of the cap source/drain epitaxial layer 109 is smaller than the lattice constant of the base source/drain epitaxial layer 108 to induce compressive stress in the base source/drain epitaxial layer 108. When the base source/drain epitaxial layer 108 is SiGe, the cap source/drain epitaxial layer 109 includes one or more of Si, SiC and SiGe having a lower Ge contents than the base source/drain epitaxial layer 108 in some embodiments. When the base source/drain epitaxial layer 108 is Ge, the cap source/drain epitaxial layer 109 includes of one or more of Si and SiGe in some embodiments. When the base source/drain epitaxial layer 108 is GeSn, the cap source/drain epitaxial layer 109 includes one or more of Si, SiGe, Ge and GeSn having a lower Sn contents than the base source/drain epitaxial layer 108 in some embodiments.

Further, the cap source/drain epitaxial layer 109 has a smoother surface than the base source/drain epitaxial layer 108. In some embodiments, the cap source/drain epitaxial layer 109 is formed at a temperature in a range from about 600° C. to about 800° C. Within this temperature range, lateral growth of adatom diffusion (atoms on the growth surface) is enhanced to make the surface of the cap source/drain epitaxial layer smoother, without affecting the remaining structures. In particular, when the gas pressure is high, the surface diffusion of adatoms are inhibited, and the adatoms are aggregated in concave portions of the base source/drain epitaxial layer 108, which makes the surface of the cap source/drain epitaxial layer smoother (flatten). When the temperature is lower than 600° C., the lateral diffusion is not sufficient, and when the temperature is higher than 800° C., the fin structure may be damaged. The surface roughness Ra measured along the X direction (source-to-drain direction) at a center region of the cap source/drain epitaxial layer 109 is greater than zero (i.e., not flat) and smaller than the surface roughness of the base source/drain epitaxial layer before the cap source/drain epitaxial layer is formed in some embodiments. The surface roughness Ra of the cap source/drain epitaxial layer 109 is in a range from about 0.2 nm to about 5 nm in some embodiments. The surface roughness Ra of the cap source/drain epitaxial layer 109 is in a range from about 0.5 nm to about 2 nm in other embodiments. The surface roughness Ra of the cap source/drain epitaxial layer 109 is about 1/20 to about 1/5 of the surface roughness of the base source/drain epitaxial layer 108 before the cap source/drain epitaxial layer is formed in some embodiments.

In some embodiments, the thickness of the cap source/drain epitaxial layer 109 is in a range from about 5 nm to about 25 nm, and is in a range from about 10 nm to about 20 nm in other embodiments. In some embodiments, the thickness of the cap source/drain epitaxial layer 109 is about 1/10 to about 1/5 of the thickness of the base source/drain epitaxial layer 108. The thicknesses of the cap and base source/drain epitaxial layers are an average thickness as measured from the upper surface of the fin bottom structure 100A. In some embodiments, the cap source/drain epitaxial layer 109 touches the channel semiconductor layer 102, and in other embodiments, the cap source/drain epitaxial layer 109 does not touch the channel semiconductor layer 102. In some embodiments, the cap source/drain epitaxial layer 109 touches the sidewall spacers 107. In some embodiments, the cap source/drain epitaxial layer 109 touches the second isolation insulating layer 104, and in other embodiments, the cap source/drain epitaxial layer 109 does not touch the second isolation insulating layer 104. In some embodiments, the bottommost portion of the cap source/drain epitaxial layer 109 is lower than the bottom of the sidewall spacers 107 or the top of the channel semiconductor layer 102, and in other embodiments, the bottommost portion of the cap source/drain epitaxial layer 109 is higher than the bottom of the sidewall spacers 107 or the top of the channel semiconductor layer 102. In some embodiments, the topmost portion of the cap source/drain epitaxial layer 109 is lower than the bottom of the sidewall spacers 107 or the top of the channel semiconductor layer 102, and in other embodiments, the topmost portion of the cap source/drain epitaxial layer 109 is higher than the bottom of the sidewall spacers 107 or the top of the channel semiconductor layer 102.

Figure 10A:
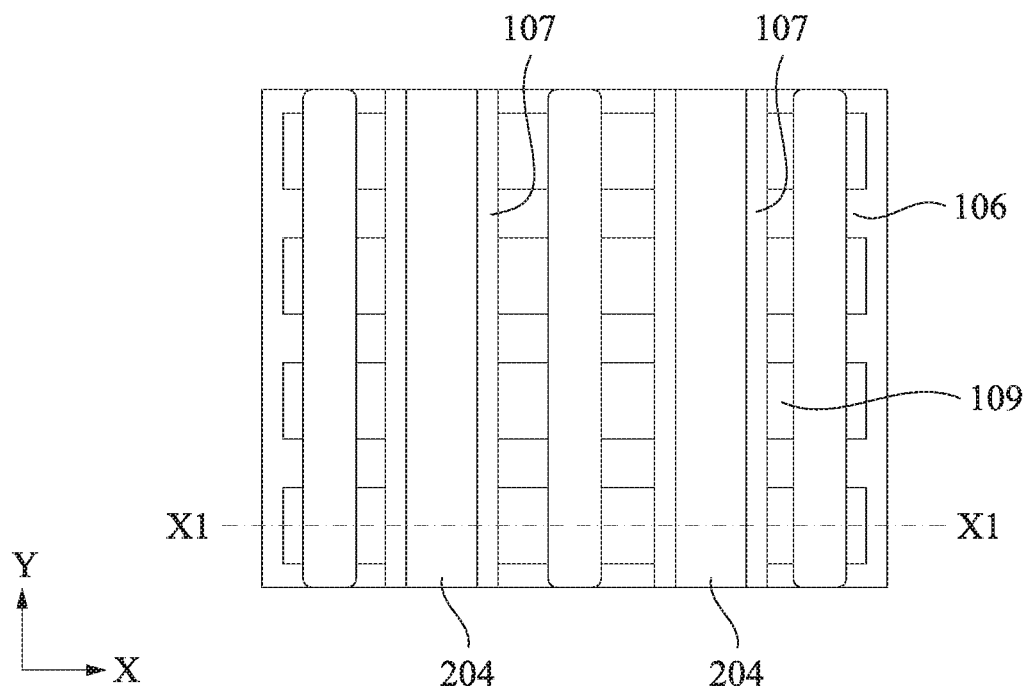
FIGS. 10A, 10B, 10C and 10D show one of the various stages of sequential processes for manufacturing a semiconductor device having a FinFET according to another embodiment of the present disclosure.
Figure 10B:
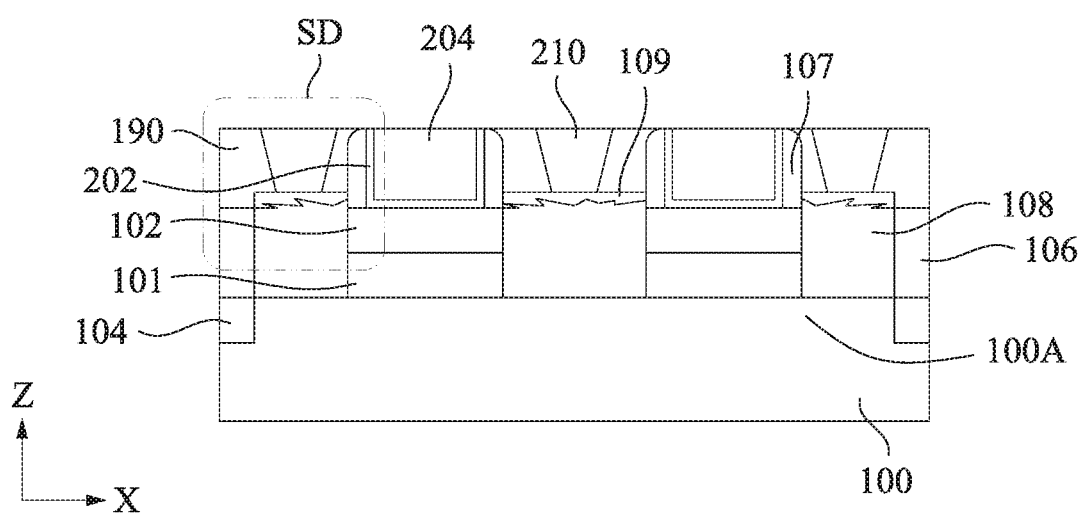
Figure 10C:
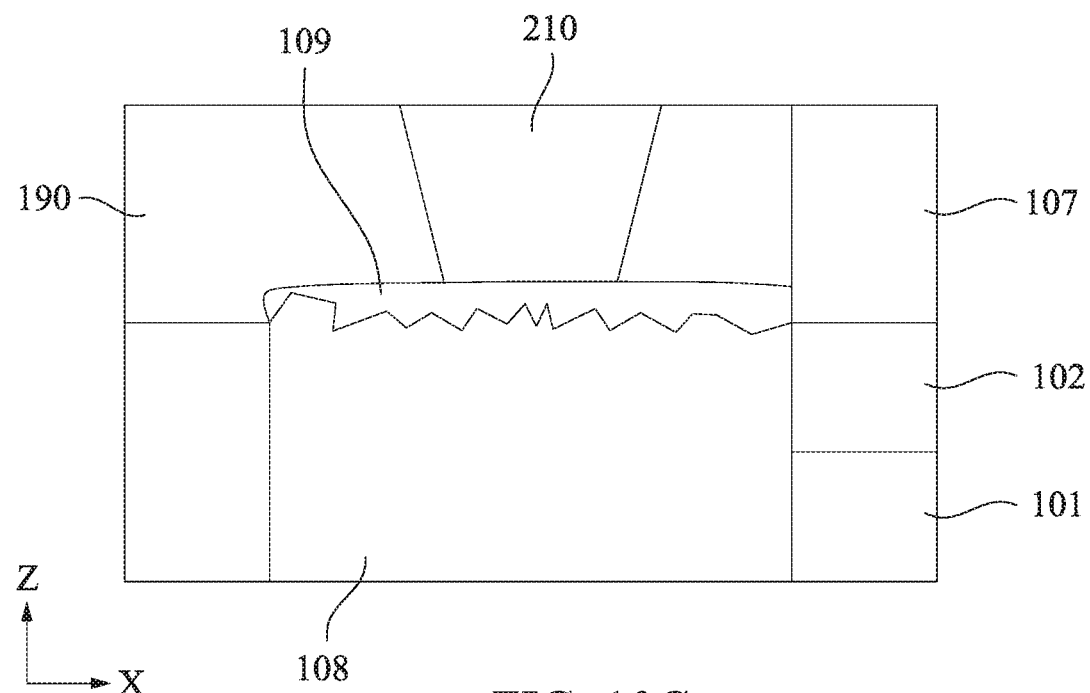
Figure 10D:
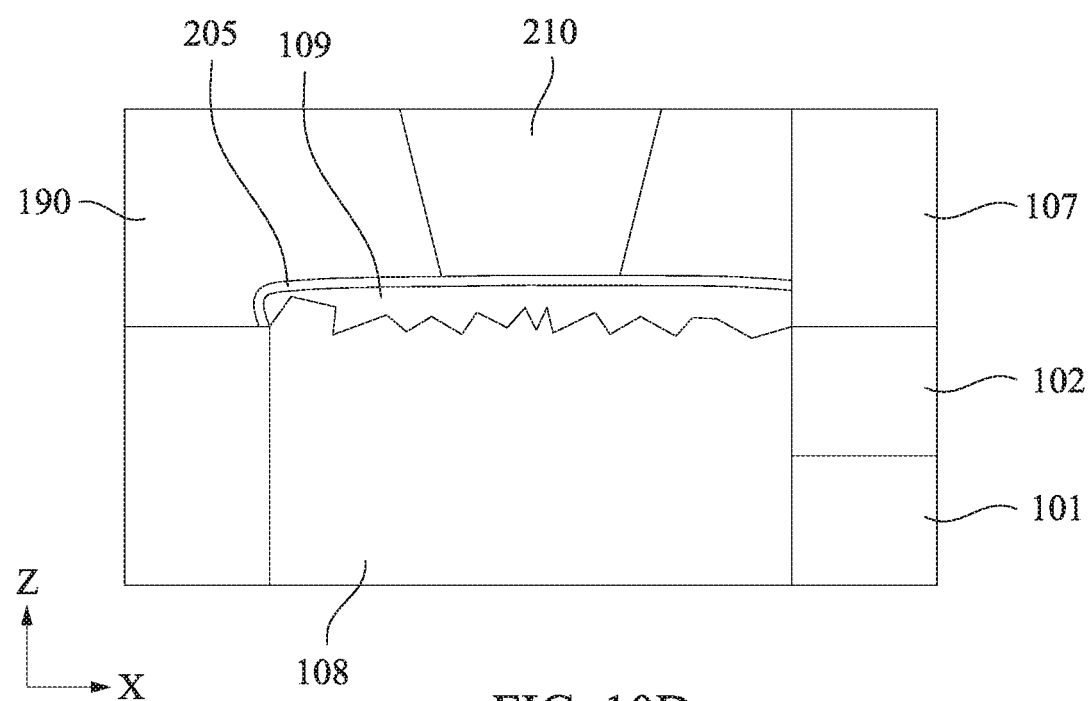

FIGS. 10A and 10B show one of the various stages of sequential processes for manufacturing a semiconductor device having a FinFET according to an embodiment of the present disclosure. FIG. 10B is a cross sectional view corresponding to line X1-X1 of FIG. 10A. FIGS. 10C and 10D are enlarged views of area SD of FIG. 10B. After the cap source/drain epitaxial layer 109 is formed, an interlayer dielectric (ILD) layer 190 is formed over the second isolation insulating layer and the source/drain structure. The materials for the ILD layer 190 include compounds comprising Si, O, C and/or H, such as silicon oxide, SiCOH and SiOC. Organic materials, such as polymers, may be used for the ILD layer 190. After the ILD layer 190 is formed, a planarization operation, such as CMP, is performed, so that the top portions of the dummy gate electrode layer 105 is are exposed.

Next, the dummy gate electrode layer 105 and the hard mask layer 103 (also functioning as a dummy gate dielectric layer) therebelow are removed, thereby forming a gate space, in which the channel semiconductor layer 102 and side faces of the buffer semiconductor layer 101 are exposed. The sidewall spacers 107 are not removed. The ILD layer 190 protects the source/drain structure during the removal of the dummy gate structure. The dummy gate structure can be removed using plasma dry etching and/or wet etching. When the dummy gate electrode layer is polysilicon and the ILD layer 190 is silicon oxide, a wet etchant such as a TMAH solution can be used to selectively remove the dummy gate electrode layer. The hard mask layer and/or the dummy gate dielectric layer are thereafter removed using plasma dry etching and/or wet etching.

After the gate space is formed, a gate dielectric layer 202 is formed over the exposed fin structures (channel and buffer semiconductor layers). In some embodiments, the gate dielectric layer 202 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 202 includes an interfacial layer formed between the channel layers and the dielectric material.

The gate dielectric layer 202 may be formed by CVD, ALD or any suitable method. In one embodiment, the gate dielectric layer 202 is formed using a highly conformal deposition process such as ALD in order to ensure the formation of a gate dielectric layer having a uniform thickness around each channel layers. The thickness of the gate dielectric layer 202 is in a range from about 1 nm to about 6 nm in one embodiment.

Subsequently, a gate electrode layer 204 is formed on the gate dielectric layer 202. The gate electrode layer 204 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 204 may be formed by CVD, ALD, electro-plating, or other suitable methods. The gate dielectric layer and the electrode layer are also deposited over the upper surface of the ILD layer 190. The gate dielectric layer and the gate electrode layer formed over the ILD layer 190 are then planarized by using, for example, CMP, until the top surface of the ILD layer 190 is revealed, as shown in FIG. 10B.

In certain embodiments of the present disclosure, one or more work function adjustment layers (not shown) are interposed between the gate dielectric layer 202 and the gate electrode layer 204. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

After the metal gate structures are formed, the ILD layer 190 is partially etched (patterned) by using lithography and etching operations, to form contact openings, in which the source/drain regions are exposed. Then, in the contact openings, a conductive material is formed. The conductive material is formed in and over the contact openings and then a planarization operation, such as a CMP operation, is performed to form contacts 210. The conductive material includes one or more layers of Co, Ni, W, Ti, Ta, Cu, Al, TiN and TaN, or any other suitable material. In some embodiments, a silicide layer 205 is formed over the cap source/drain epitaxial layer 108 before forming the conductive material, as shown in FIG. 10D. The silicide layer includes one or more of WSi, CoSi, NiSi, TiSi, MoSi and TaSi.

It is understood that the FinFETs undergo further CMOS processes to form various features such as, interconnect metal layers, dielectric layers, passivation layers, etc.

FIGS. 11A-12C show sequential processes for manufacturing a semiconductor device having a FinFET according to another embodiment of the present disclosure. It is understood that additional operations can be provided before, during, and after processes shown by FIGS. 11A-12C, and some of the operations described below can be replaced or eliminated, for additional embodiments of the method. The order of the operations/processes may be interchangeable.

Figure 11A:
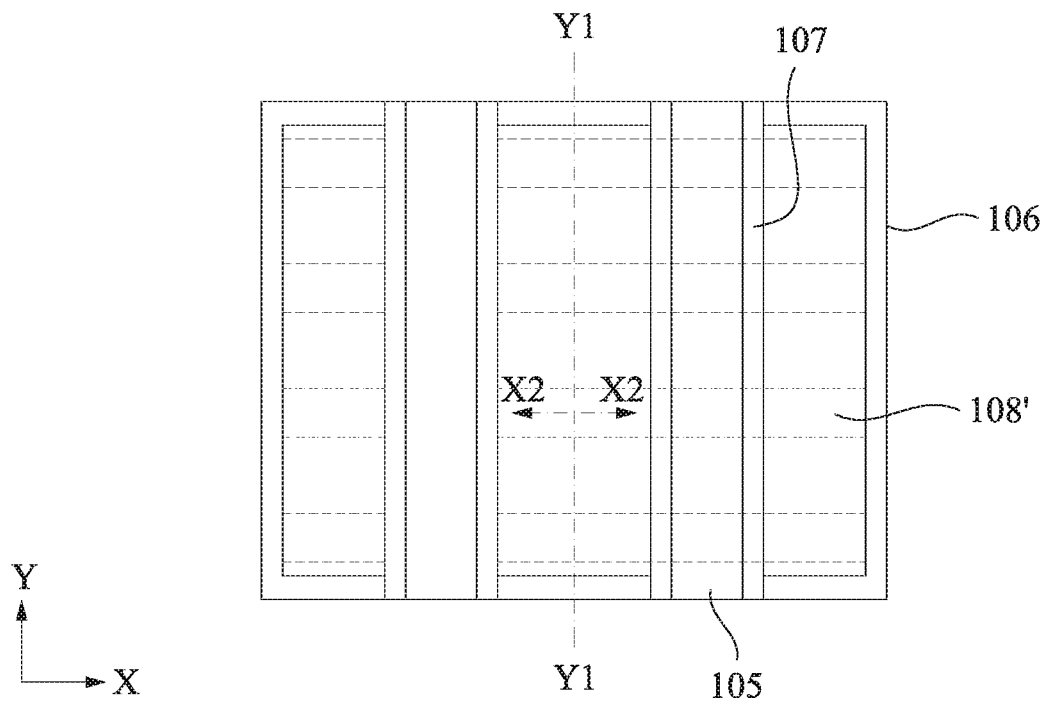
FIGS. 11A, 11B and 11C show one of the various stages of sequential processes for manufacturing a semiconductor device having a FinFET according to another embodiment of the present disclosure.

As explained with respect to FIGS. 7A and 7B, a trench 90 is formed by etching the source/drain region of the channel semiconductor layer 102 and the buffer semiconductor layer 101. Then, the base source/drain epitaxial layer 108' is formed, as shown in FIGS. 11A (a plan view), 11B (a cross sectional view corresponding to Y1-Y1 of FIGS. 11A) and 11C (a cross sectional view corresponding to X2-X2 of FIG. 11A). In these embodiments, adjacent base epitaxial layers have a diamond-like shape and are merged to form a merged base epitaxial layer 108'. In some embodiments, a gap 112 is formed between the merged epitaxial layer 108' and the isolation insulating layer 104. The materials, configuration and/or structures of the base epitaxial layer 108' are the same as those of the base epitaxial layer 108.

Figure 11B:
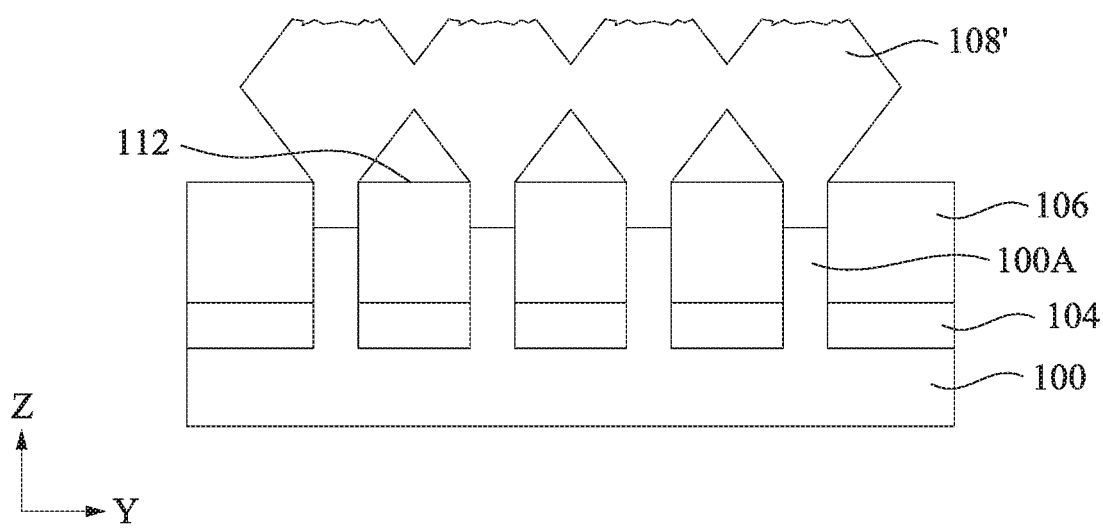
Figure 11C:
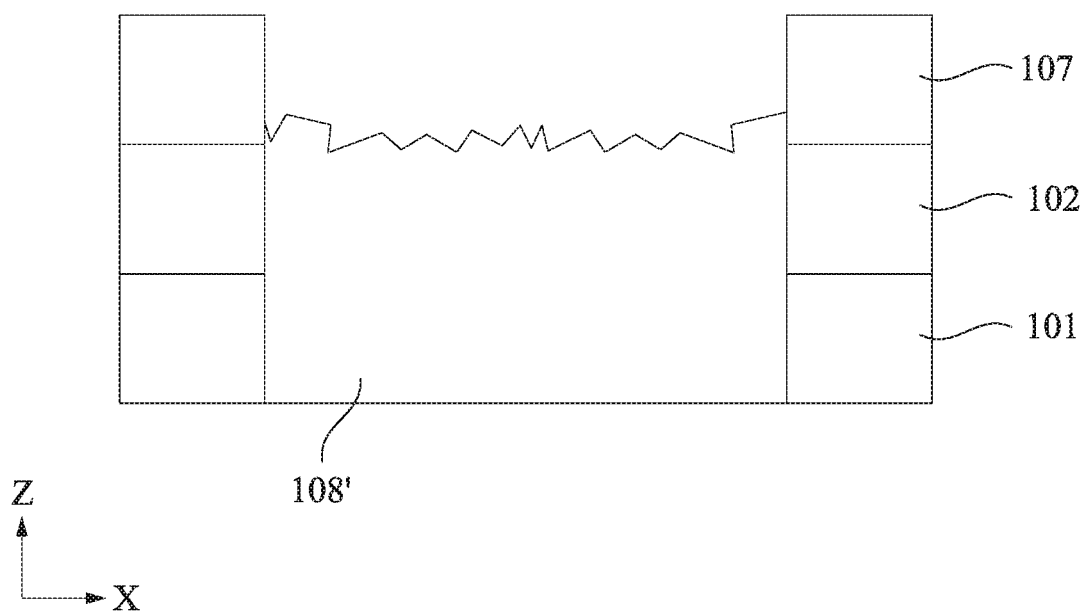

As shown in FIGS. 11B and 11C, the upper surface of the base source/drain epitaxial layer 108' is rough or uneven. The surface roughness Ra measured along the X direction (source-to-drain direction) at a center region above the fin bottom structure 100A is in a range from about 2 nm to about 10 nm in some embodiments.

Figure 12A:
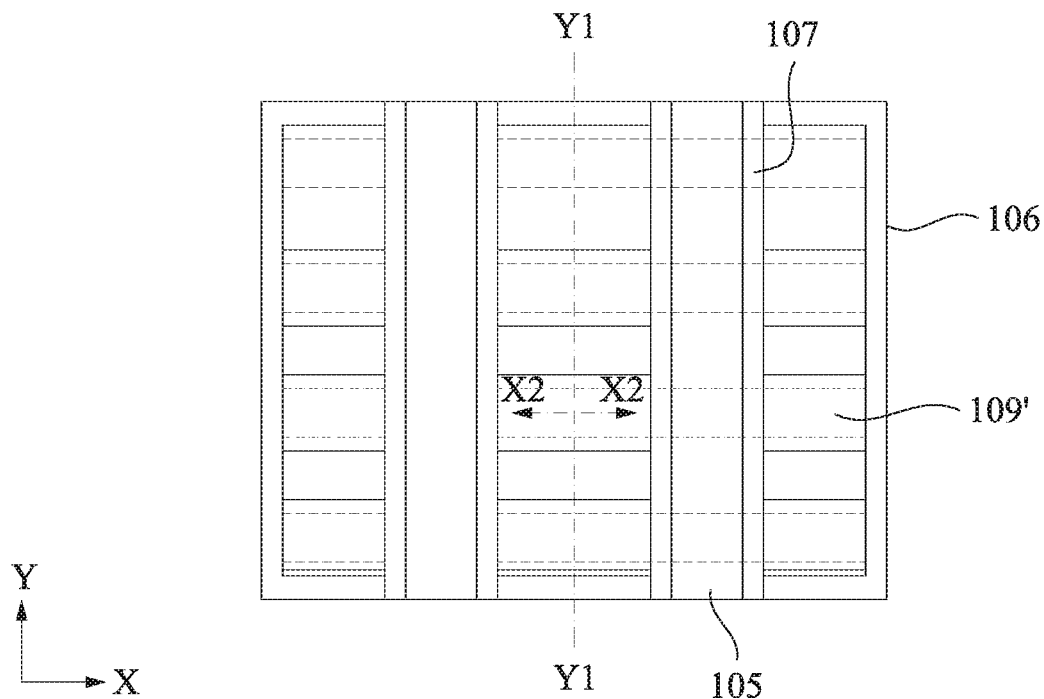
FIGS. 12A, 12B and 12C show one of the various stages of sequential processes for manufacturing a semiconductor device having a FinFET according to another embodiment of the present disclosure.
Figure 12B:
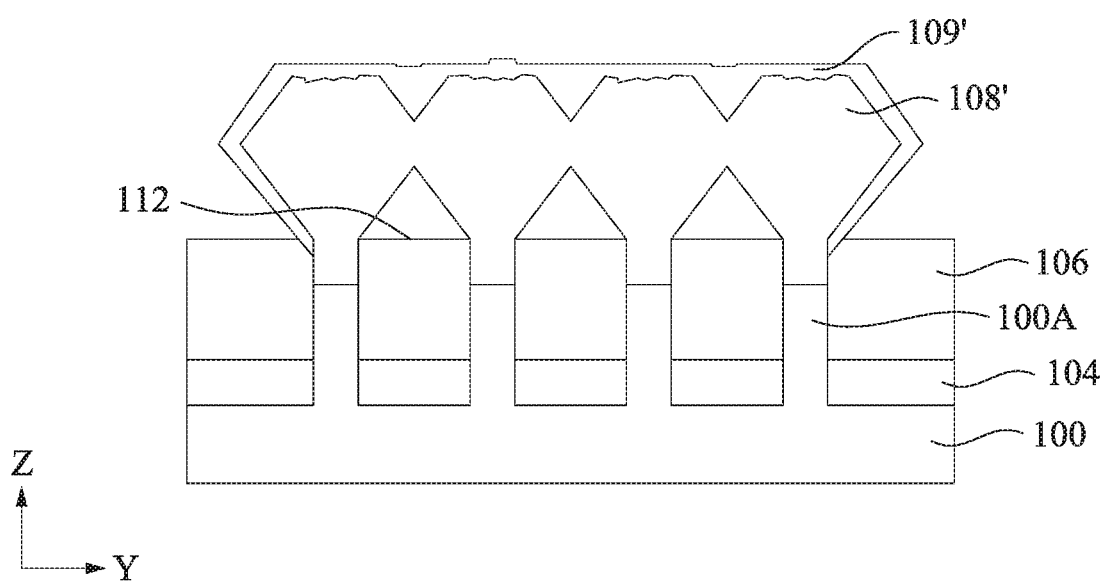
Figure 12C:
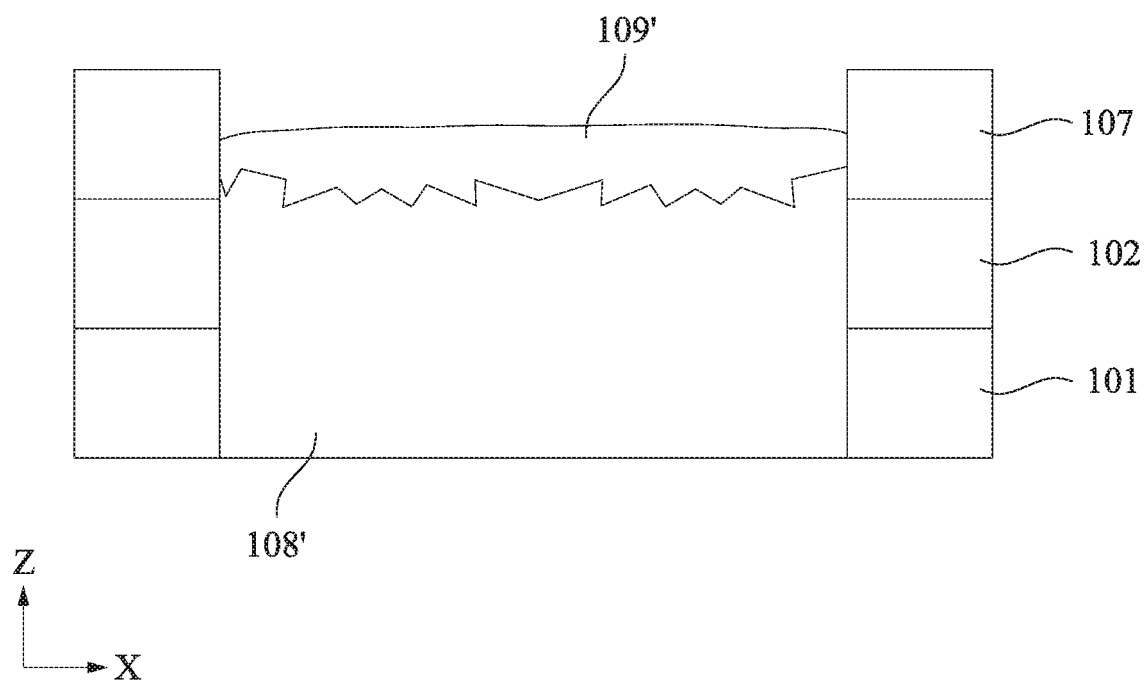

Subsequently, similar to FIGS. 9A-9D, a cap source/drain epitaxial layer 109' is formed over the merged base epitaxial layer 108', as shown in FIGS. 12A-12C. FIG. 12A is a plan view, FIG. 12B is a cross sectional view corresponding to Y1-Y1 of FIG. 12A and FIG. 12C is a cross sectional view corresponding to X2-X2 of FIG. 12A. The materials, configuration and/or structures of the cap source/drain epitaxial layer 109' are the same as those of the cap source/drain epitaxial layer 109. The cap source/drain epitaxial layer 109' is not formed in the gap 112 in some embodiments.

The surface roughness Ra measured along the X direction (source-to-drain direction) at a center region of the cap source/drain epitaxial layer 109' above the fin bottom structure 100A (see FIGS. 12A and 12C) is greater than zero and smaller than the surface roughness of the merged base source/drain epitaxial layer 108' before (and after) the cap source/drain epitaxial layer is formed. The surface roughness Ra is in a range from about 0.2 nm to about 5 nm in some embodiments. The surface roughness Ra of the cap source/drain epitaxial layer 109' is in a range from about 0.5 nm to about 2 nm in other embodiments. The surface roughness Ra of the cap source/drain epitaxial layer 109' is about 1/20 to about 1/5 of the surface roughness of the base source/drain epitaxial layer 108' before the cap source/drain epitaxial layer is formed in some embodiments.

In some embodiments, the thickness of the cap source/drain epitaxial layer 109' as measured from the upper surface of the fin bottom structure 100A is in a range from about 5 nm to about 25 nm, and is in a range from about 10 nm to about 20 nm in other embodiments. In some embodiments, the thickness of the cap source/drain epitaxial layer 109' is about 1/10 to about 1/5 of the thickness of the base source/drain epitaxial layer 108'. The thicknesses of the cap and base source/drain epitaxial layers are an average thickness above the fin bottom structure 100A.

Figure 13:
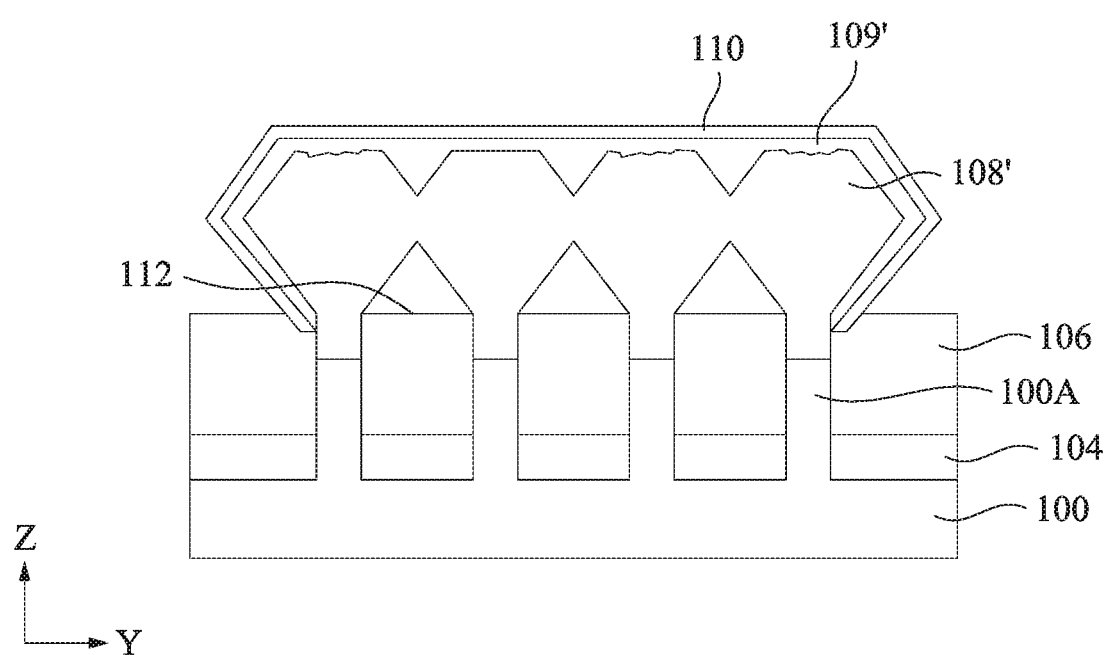
FIG. 13 shows a semiconductor device having a FinFET according to another embodiment of the present disclosure.

FIG. 13 shows a semiconductor device having a FinFET according to another embodiment of the present disclosure.

In this embodiment, an additional cap source/drain epitaxial layer 110 is formed on the cap source/drain epitaxial layer 109'. The additional cap source/drain epitaxial layer 110 further increases a stress in the source/drain epitaxial layers to be applied to the channel region.

For an n-type FET, the lattice constant of the additional cap source/drain epitaxial layer 110 is greater than the lattice constant of the cap source/drain epitaxial layer 109. When the cap source/drain epitaxial layer 109 is Si, the additional cap source/drain epitaxial layer 110 includes one or more of SiGe, Ge, Sn and GeSn in some embodiments. When the cap source/drain epitaxial layer 109 is SiGe, the additional cap source/drain epitaxial layer 110 includes one or more of SiGe having a higher Ge contents than the cap source/drain epitaxial layer 109, Ge and GeSn in some embodiments. When the cap source/drain epitaxial layer 109 is Ge, the additional cap source/drain epitaxial layer 110 includes GeSn in some embodiments.

For a p-type FET, the lattice constant of the additional cap source/drain epitaxial layer 110 is smaller than the lattice constant of the cap source/drain epitaxial layer 109. When the cap source/drain epitaxial layer 109 is SiGe, the additional cap source/drain epitaxial layer 110 includes one or more of Si and SiGe having a lower Ge contents than the cap source/drain epitaxial layer 109 in some embodiments. When the cap source/drain epitaxial layer 109 is Ge, the additional cap source/drain epitaxial layer 110 includes one or more of Si and SiGe in some embodiments. When the cap source/drain epitaxial layer 109 is GeSn, the additional cap source/drain epitaxial layer 110 includes one or more of Si, SiGe, Ge, Sn and GeSn having a lower Sn contents than the cap source/drain epitaxial layer 109 in some embodiments.

Further, the additional cap source/drain epitaxial layer 110 has a smoother surface than the cap source/drain epitaxial layer 109 before (and after) the additional cap source/drain epitaxial layer 110 is formed. The surface roughness Ra measured along the X direction at a center region of the additional cap source/drain epitaxial layer 110 is smaller than the surface roughness of the cap source/drain epitaxial layer 109, and is in a range from about 0.1 nm to about 4 nm in some embodiments. The surface roughness Ra of the additional cap source/drain epitaxial layer 109 is in a range from about 0.2 nm to about 1.5 nm in other embodiments. The surface roughness Ra of the additional cap source/drain epitaxial layer 110 is about ½ to about ⅕ of the surface roughness of the cap source/drain epitaxial layer 109.

In some embodiments, the thickness of the additional cap source/drain epitaxial layer 110 is in a range from about 5 nm to about 25 nm, and is in a range from about 10 nm to about 20 nm in other embodiments. The thickness of the additional cap source/drain epitaxial layer 110 is an average thickness above the fin bottom structure 100A.

Figure 14:
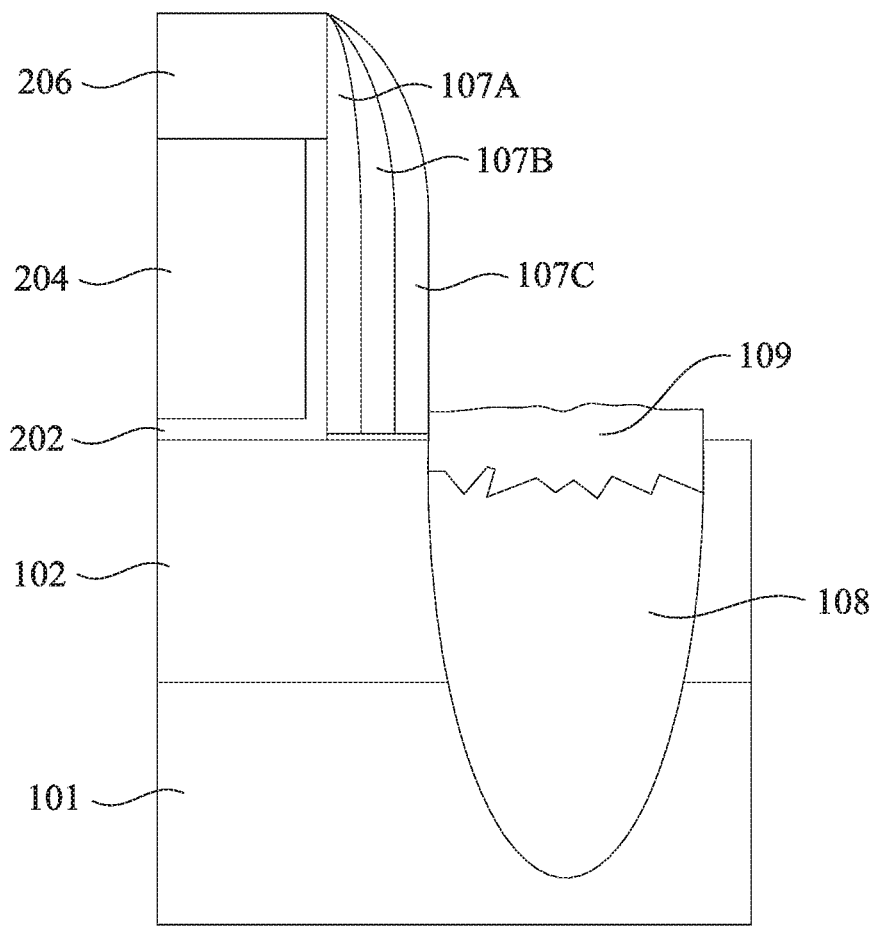
FIG. 14 shows a semiconductor device having a FinFET according to another embodiment of the present disclosure.

FIG. 14 shows a semiconductor device having a FinFET according to another embodiment of the present disclosure.

In this embodiment, the recess (trench) formed at the source/drain region of the channel semiconductor layer 102 and the buffer semiconductor 101 does not reach the fin bottom structure 100A. The upper surface of the cap source/drain epitaxial layer 109 is located above the upper surface of the channel semiconductor layer 102 in some embodiments. The sidewall spacers 107 includes three layers 107A, 107B and 107C made of different materials from each other in some embodiments. In some embodiments, a gate cap insulating layer 206 is formed over the gate electrode layer 204.

In case of an n-type FET, the cap source/drain epitaxial layer 109 induces tensile stress to the base source/drain epitaxial layer 108, which in turn induces compressive stress to the channel semiconductor layer 102. The cap source/drain epitaxial layer 109 has compressive stress.

In case of a p-type FET, the cap source/drain epitaxial layer 109 induces compressive stress to the base source/drain epitaxial layer 108, which in turn induces tensile stress to the channel semiconductor layer 102. The cap source/drain epitaxial layer 109 has tensile stress.

The foregoing embodiments can be applied to source/drain structures having epitaxial layer of any types of FET, such as a planar FET, a gate-all-around FET.

The various embodiments or examples described herein offer several advantages over the existing art. For example, in the present disclosure, by using one or more cap source/drain epitaxial layer on the base source/drain epitaxial layer, it is possible to apply appropriate stress to the base source/drain epitaxial layer and the channel of an FET. Further, the cap source/drain epitaxial layer can flatten the rough surface of the base source/drain epitaxial layer, and thus it is possible to improve interfacial characteristics with a metal contact to the source/drain structure.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure protruding from a first isolation insulating layer disposed over a substrate is formed, a dummy gate structure is formed over an upper portion of the fin structure, a second isolation insulating layer is formed over the first isolation insulating layer, a trench is formed by etching a source/drain region of the fin structure, a base semiconductor epitaxial layer is formed in the trench, and a cap semiconductor epitaxial layer is formed on the base semiconductor epitaxial layer. The cap semiconductor epitaxial layer has a different lattice constant than the base semiconductor epitaxial layer, and a surface of the cap semiconductor epitaxial layer is smoother than a surface of the base semiconductor epitaxial layer. In one or more of the foregoing or following embodiments, the semiconductor device is a p-type field effect transistor (FET), and a lattice constant of the cap semiconductor epitaxial layer is smaller than a lattice constant of the base semiconductor epitaxial layer. In one or more of the foregoing or following embodiments, the semiconductor device is an n-type field effect transistor (FET), and a lattice constant of the cap semiconductor epitaxial layer is greater than a lattice constant of the base semiconductor epitaxial layer. In one or more of the foregoing or following embodiments, the second isolation insulating layer is made of a different material than the first isolation insulating layer. In one or more of the foregoing or following embodiments, the second isolation insulating layer is made of at least one of SiOC and SiOCN. In one or more of the foregoing or following embodiments, the fin structure is formed by the following operations. A buffer semiconductor layer is over the substrate, a channel semiconductor layer is formed on the buffer semiconductor layer, a hard mask pattern is formed over the channel semiconductor layer, and the channel semiconductor layer and the buffer semiconductor layer are patterned by etching using the hard mask pattern as an etching mask. The fin structure includes the patterned buffer semiconductor layer, the patterned channel semiconductor layer and the hard mask pattern. In one or more of the foregoing or following embodiments, in the patterning to form the fin structure, a part of the substrate is also patterned, and the fin structure further includes a fin bottom structure, which is the patterned part of the substrate, on which the patterned buffer semiconductor layer is formed. In one or more of the foregoing or following embodiments, the dummy gate structure is formed over the hard mask pattern, and the method further comprises patterning the hard mask pattern by etching using the dummy gate structure as an etching mask. In one or more of the foregoing or following embodiments, the second isolation insulating layer is also etched when the hard mask pattern is etched such that an upper surface of the second isolation insulating layer is located at a level equal to or below an upper surface of the channel semiconductor layer. In one or more of the foregoing or following embodiments, after the trench is formed, the fin bottom structure is exposed at a bottom of the trench, and the base semiconductor epitaxial layer is formed on the exposed fin bottom structure. In one or more of the foregoing or following embodiments, after the trench is formed, a part of the buffer semiconductor layer remains, and the base semiconductor epitaxial layer is formed on the remaining part of the buffer semiconductor layer. In one or more of the foregoing or following embodiments, an additional cap semiconductor epitaxial layer is formed on the cap semiconductor epitaxial layer. The additional cap semiconductor epitaxial layer has a different lattice constant than the cap semiconductor epitaxial layer and the base semiconductor epitaxial layer. In one or more of the foregoing or following embodiments, the semiconductor device is a p-type field effect transistor (FET), a lattice constant of the cap semiconductor epitaxial layer is smaller than a lattice constant of the base semiconductor epitaxial layer, and a lattice constant of the additional cap semiconductor epitaxial layer is smaller than the lattice constant of the cap semiconductor epitaxial layer. In one or more of the foregoing or following embodiments, the semiconductor device is an n-type field effect transistor (FET), a lattice constant of the cap semiconductor epitaxial layer is greater than a lattice constant of the base semiconductor epitaxial layer, and a lattice constant of the additional cap semiconductor epitaxial layer is greater than the lattice constant of the cap semiconductor epitaxial layer.

In accordance with another aspect of the present disclosure, in a method of manufacturing a semiconductor device, fin structures protruding from a first isolation insulating layer disposed over a substrate are formed, a dummy gate structure is formed over upper portions of the fin structures, a second isolation insulating layer is formed over the first isolation insulating layer, trenches are formed by etching source/drain regions of the fin structures, a base semiconductor epitaxial layer is formed in the trenches, and a cap semiconductor epitaxial layer is formed on the base semiconductor epitaxial layer. The cap semiconductor epitaxial layer has a different lattice constant than the base semiconductor epitaxial layer. The base semiconductor epitaxial layer is a merged epitaxial layer coupled to the fin structures. A lattice constant of the cap semiconductor epitaxial layer is greater than a lattice constant of the base semiconductor epitaxial layer, and a surface roughness of the cap semiconductor epitaxial layer along a source-to-drain direction is smaller than a surface roughness of the base semiconductor epitaxial layer along the source-to-drain direction. In one or more of the foregoing or following embodiments, the base semiconductor epitaxial layer is made of one or more layers of SiP, SiC and SiCP, and the cap semiconductor epitaxial layer is made of one of SiGe, Ge and GeSn. In one or more of the foregoing or following embodiments, an additional cap semiconductor epitaxial layer having a greater lattice constant than the cap semiconductor epitaxial layer is formed on the cap semiconductor epitaxial layer, and the additional cap semiconductor epitaxial layer is made of one of SiGe, Ge and GeSn.

In accordance with another aspect of the present disclosure in a method of manufacturing a semiconductor device, fin structures protruding from a first isolation insulating layer disposed over a substrate are formed, a dummy gate structure is formed over upper portions of the fin structures, a second isolation insulating layer is formed over the first isolation insulating layer, trenches are formed by etching source/drain regions of the fin structures, a base semiconductor epitaxial layer is formed in the trenches and a cap semiconductor epitaxial layer is formed on the base semiconductor epitaxial layer. The cap semiconductor epitaxial layer having a different lattice constant than the base semiconductor epitaxial layer. The base semiconductor epitaxial layer is a merged epitaxial layer coupled to the fin structures. A lattice constant of the cap semiconductor epitaxial layer is smaller than a lattice constant of the base semiconductor epitaxial layer. A surface roughness of the cap semiconductor epitaxial layer along a source-to-drain direction is smaller than a surface roughness of the base semiconductor epitaxial layer along the source-to-drain direction. In one or more of the foregoing or following embodiments, the base semiconductor epitaxial layer is made of one or more layers of SiGe, Ge and GeSn, and the cap semiconductor epitaxial layer is made of one of SiGe and Ge. In one or more of the foregoing or following embodiments, an additional cap semiconductor epitaxial layer having a smaller lattice constant than the cap semiconductor epitaxial layer is formed on the cap semiconductor epitaxial layer. The additional cap semiconductor epitaxial layer is made of one of Si and SiGe.

In accordance with one aspect of the present disclosure, a semiconductor device includes a fin structure protruding from a first isolation insulating layer provided over a substrate, a gate dielectric layer disposed over a channel region of the fin structure, a gate electrode layer disposed over the gate dielectric layer, a base semiconductor epitaxial layer disposed over a source/drain region of the fin structure, and a cap semiconductor epitaxial layer disposed over the base semiconductor epitaxial layer. The cap semiconductor epitaxial layer has a different lattice constant than the base semiconductor epitaxial layer. A surface roughness of the cap semiconductor epitaxial layer along a source-to-drain direction is greater than zero and smaller than a surface roughness of the base semiconductor epitaxial layer along the source-to-drain direction. In one or more of the foregoing or following embodiments, the semiconductor device is an n-type field effect transistor (FET), and a lattice constant of the cap semiconductor epitaxial layer is greater than a lattice constant of the base semiconductor epitaxial layer. In one or more of the foregoing or following embodiments, the base semiconductor epitaxial layer is made of one or more layers of SiP, SiC and SiCP, and the cap semiconductor epitaxial layer is made of one of SiGe, Ge and GeSn. In one or more of the foregoing or following embodiments, the semiconductor device further includes an additional cap semiconductor epitaxial layer having a greater lattice constant than the cap semiconductor epitaxial layer disposed on the cap semiconductor epitaxial layer. The additional cap semiconductor epitaxial layer is made of one of SiGe, Ge and GeSn. In one or more of the foregoing or following embodiments, the semiconductor device is a p-type field effect transistor (FET), and a lattice constant of the cap semiconductor epitaxial layer is smaller than a lattice constant of the base semiconductor epitaxial layer. In one or more of the foregoing or following embodiments, the base semiconductor epitaxial layer is made of one or more layers of SiGe, Ge and GeSn, and the cap semiconductor epitaxial layer is made of one of SiGe and Ge. In one or more of the foregoing or following embodiments, the semiconductor device further includes an additional cap semiconductor epitaxial layer having a smaller lattice constant than the cap semiconductor epitaxial layer disposed on the cap semiconductor epitaxial layer. The additional cap semiconductor epitaxial layer is made of one of Si and SiGe. In one or more of the foregoing or following embodiments, the fin structure includes a fin bottom protruding from the substrate, a buffer semiconductor layer disposed over the fin bottom, and a channel semiconductor layer disposed on the buffer semiconductor layer and having a different lattice constant than the buffer semiconductor layer. The base semiconductor epitaxial layer is in contact with the buffer semiconductor layer and the channel semiconductor layer. In one or more of the foregoing or following embodiments, the substrate is made of Si, the buffer semiconductor layer includes $Si_{1-x}Ge_x$, and the channel semiconductor layer includes $Si_{1-y}Ge_y$, where $0<x<y\leq1.0$. In one or more of the foregoing or following embodiments, the semiconductor device further includes a second isolation insulating layer made of a different insulating material than the first isolation insulating layer disposed on the first isolation insulating layer. The second isolation insulating layer is in contact with the base semiconductor epitaxial layer. In one or more of the foregoing or following embodiments, the first isolation insulating layer is not in contact with the base semiconductor epitaxial layer. In one or more of the foregoing or following embodiments, the second isolation insulating layer includes a porous SiOC.

In accordance with another aspect of the present disclosure, a semiconductor device includes fin structures protruding from a first isolation insulating layer provided over a substrate, a gate dielectric layer disposed over a channel region of each of the fin structures, a gate electrode layer disposed over the gate dielectric layer, a merged base semiconductor epitaxial layer disposed over source/drain regions of the fin structures, and a cap semiconductor epitaxial layer disposed over the base semiconductor epitaxial layer. The cap semiconductor epitaxial layer has a different lattice constant than the merged base semiconductor epitaxial layer. A surface of the cap semiconductor epitaxial layer along a source-to-drain direction over one of the fin structures is not flat but is smoother than a surface of the merged base semiconductor epitaxial layer. In one or more of the foregoing or following embodiments, the semiconductor device is an n-type field effect transistor (FET), and a lattice constant of the cap semiconductor epitaxial layer is greater than a lattice constant of the base semiconductor epitaxial layer. In one or more of the foregoing or following embodiments, the semiconductor device further includes an additional cap semiconductor epitaxial layer having a greater lattice constant than the cap semiconductor epitaxial layer disposed on the cap semiconductor epitaxial layer. In one or more of the foregoing or following embodiments, the base semiconductor epitaxial layer is made of one or more layers of SiP, SiC and SiCP, the cap semiconductor epitaxial layer is made of one of SiGe, Ge and GeSn, and the additional cap semiconductor epitaxial layer is made of one of SiGe, Ge and GeSn. In one or more of the foregoing or following embodiments, the semiconductor device is a p-type field effect transistor (FET), and a lattice constant of the cap semiconductor epitaxial layer is smaller than a lattice constant of the base semiconductor epitaxial layer. In one or more of the foregoing or following embodiments, the semiconductor device further includes an additional cap semiconductor epitaxial layer having a smaller lattice constant than the cap semiconductor epitaxial layer disposed on the cap semiconductor epitaxial layer. In one or more of the foregoing or following embodiments, the base semiconductor epitaxial layer is made of one or more layers of SiGe, Ge and GeSn, the cap semiconductor epitaxial layer is made of one of SiGe and Ge, and the additional cap semiconductor epitaxial layer is made of one of Si and SiGe.

In accordance with another aspect of the present disclosure, a semiconductor device includes fin structures protruding from a first isolation insulating layer provided over a substrate. Each of the fin structures includes a fin bottom protruding from the substrate, a buffer semiconductor layer disposed over the fin bottom and a channel semiconductor layer disposed on the buffer semiconductor layer and having a different lattice constant than the buffer semiconductor layer. The semiconductor device further includes a second isolation insulating layer disposed over the first isolation insulating layer and made of a different insulating material than the first isolation insulating layer, a gate dielectric layer disposed over a channel region of each of the fin structures, a gate electrode layer disposed over the gate dielectric layer, a merged base semiconductor epitaxial layer disposed over source/drain regions of the fin structures and being in contact with the second isolation insulating layer, and a cap semiconductor epitaxial layer disposed over the base semiconductor epitaxial layer. The cap semiconductor epitaxial layer has a different lattice constant than the merged base semiconductor epitaxial layer. A surface roughness of the cap semiconductor epitaxial layer along a source-to-drain direction is greater than zero and smaller than a surface roughness of the merged base semiconductor epitaxial layer along the source-to-drain direction.

In accordance with one aspect of the present disclosure, a semiconductor device, comprising a p-type FET and an n-type FET. Each of the p-type FET and the n-type FET includes a fin structure protruding from a first isolation insulating layer provided over a substrate, and having a fin bottom protruding from the substrate, a buffer semiconductor layer disposed over the fin bottom and a channel semiconductor layer disposed on the buffer semiconductor layer and having a different lattice constant than the buffer semiconductor layer. Each of the p-type FET and the n-type FET further includes a second isolation insulating layer disposed over the first isolation insulating layer and made of a different insulating material than the first isolation insulating layer, a gate dielectric layer disposed over a channel region of the fin structure, a gate electrode layer disposed over the gate dielectric layer, a base semiconductor epitaxial layer disposed over a source/drain region of the fin structure and being in contact with the second isolation insulating layer, and a cap semiconductor epitaxial layer disposed over the base semiconductor epitaxial layer. A surface roughness of the cap semiconductor epitaxial layer along a source-to-drain direction is greater than zero and smaller than a surface roughness of the base semiconductor epitaxial layer along the source-to-drain direction. In the p-type FET, a lattice constant of the cap semiconductor epitaxial layer is smaller than a lattice constant of the base semiconductor epitaxial layer, and in the n-type FET, a lattice constant of the cap semiconductor epitaxial layer is greater than a lattice constant of the base semiconductor epitaxial layer. The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a fin structure protruding from a first isolation insulating layer disposed over a substrate;
    forming a dummy gate structure over an upper portion of the fin structure;
    after the dummy gate structure is formed, forming a second isolation insulating layer over the first isolation insulating layer;
    after the second isolation insulating layer is formed, forming gate sidewall spacers made of an insulating material different from the second isolation insulating layer on opposing side faces of the dummy gate structure;
    after the gate sidewall spacers are formed, forming a trench by etching a source/drain region of the fin structure;
    forming a base semiconductor epitaxial layer in the trench; and
    forming a cap semiconductor epitaxial layer on the base semiconductor epitaxial layer, the cap semiconductor epitaxial layer having a different lattice constant than the base semiconductor epitaxial layer, wherein:
    the fin structure extends in a first direction, the dummy gate structure extends in a second direction crossing the first direction and the source/drain region is adjacent to the dummy gate structure along the first direction, in plan view, and
    a surface of the cap semiconductor epitaxial layer formed above the trench along the first direction is smoother than a surface of the base semiconductor epitaxial layer formed in the trench along the first direction.

2. The method of claim 1, wherein:
the semiconductor device is a p-type field effect transistor (FET), and
a lattice constant of the cap semiconductor epitaxial layer is smaller than a lattice constant of the base semiconductor epitaxial layer.

3. The method of claim 1, wherein:
the semiconductor device is an n-type field effect transistor (FET), and
a lattice constant of the cap semiconductor epitaxial layer is greater than a lattice constant of the base semiconductor epitaxial layer.

4. The method of claim 1, wherein the second isolation insulating layer is made of a different material than the first isolation insulating layer.

5. The method of claim 4, wherein the second isolation insulating layer is made of at least one of SiOC and SiOCN.

6. The method of claim 1, wherein the fin structure is formed by:
forming a buffer semiconductor layer over the substrate;
forming a channel semiconductor layer on the buffer semiconductor layer;
forming a hard mask pattern over the channel semiconductor layer; and
patterning the channel semiconductor layer and the buffer semiconductor layer by etching using the hard mask pattern as an etching mask,
wherein the fin structure includes the patterned buffer semiconductor layer, the patterned channel semiconductor layer and the hard mask pattern.

7. The method of claim 6, wherein:
in the patterning to form the fin structure, a part of the substrate is also patterned, and
wherein the fin structure further includes a fin bottom structure, which is the patterned part of the substrate, on which the patterned buffer semiconductor layer is formed.

8. The method of claim 6, wherein:
the dummy gate structure is formed over the hard mask pattern, and
the method further comprises patterning the hard mask pattern by etching using the dummy gate structure as an etching mask.

9. The method of claim 8, wherein the second isolation insulating layer is also etched when the hard mask pattern is etched such that an upper surface of the second isolation insulating layer is located at a level equal to or below an upper surface of the channel semiconductor layer.

10. The method of claim 7, wherein after the trench is formed, the fin bottom structure is exposed at a bottom of the trench, and the base semiconductor epitaxial layer is formed on the exposed fin bottom structure.

11. The method of claim 7, wherein after the trench is formed, a part of the buffer semiconductor layer remains, and the base semiconductor epitaxial layer is formed on the remaining part of the buffer semiconductor layer.

12. The method of claim 1, further comprising forming an additional cap semiconductor epitaxial layer on the cap semiconductor epitaxial layer,
wherein the additional cap semiconductor epitaxial layer has a different lattice constant than the cap semiconductor epitaxial layer and the base semiconductor epitaxial layer.

13. The method of claim 12, wherein:
the semiconductor device is a p-type field effect transistor (FET),
a lattice constant of the cap semiconductor epitaxial layer is smaller than a lattice constant of the base semiconductor epitaxial layer, and
a lattice constant of the additional cap semiconductor epitaxial layer is smaller than the lattice constant of the cap semiconductor epitaxial layer.

14. The method of claim 12, wherein:
the semiconductor device is an n-type field effect transistor (FET),
a lattice constant of the cap semiconductor epitaxial layer is greater than a lattice constant of the base semiconductor epitaxial layer, and
a lattice constant of the additional cap semiconductor epitaxial layer is greater than the lattice constant of the cap semiconductor epitaxial layer.

15. A method of manufacturing a semiconductor device, the method comprising:
forming fin structures protruding from a first isolation insulating layer disposed over a substrate;
forming a dummy gate structure over upper portions of the fin structures;
after the dummy gate structure is formed, forming a second isolation insulating layer over the first isolation insulating layer;
after the second isolation insulating layer is formed, forming gate sidewall spacers on opposing side faces of the dummy gate structure;
after the gate sidewall spacers are formed, forming trenches by etching source/drain regions of the fin structures;
forming a base semiconductor epitaxial layer in each of the trenches; and
forming a cap semiconductor epitaxial layer on the base semiconductor epitaxial layer, the cap semiconductor epitaxial layer having a different lattice constant than the base semiconductor epitaxial layer, wherein:
the base semiconductor epitaxial layer is a merged epitaxial layer coupled to the fin structures,
a lattice constant of the cap semiconductor epitaxial layer is greater than a lattice constant of the base semiconductor epitaxial layer,
the fin structures extend in a first direction, the dummy gate structure extends in a second direction crossing the first direction and the source/drain regions are adjacent to the dummy gate structure along the first direction, in plan view, and
a surface roughness of the cap semiconductor epitaxial layer formed above each of the trenches along the first direction is smaller than a surface roughness of the base semiconductor epitaxial layer formed in each of the trenches along the first direction.

16. The method of claim 15, wherein:
the base semiconductor epitaxial layer is made of one or more layers of SiP, SiC and SiCP, and
the cap semiconductor epitaxial layer is made of one of SiGe, Ge and GeSn.

17. The method of claim 16, further comprising:
forming an additional cap semiconductor epitaxial layer having a greater lattice constant than the cap semiconductor epitaxial layer on the cap semiconductor epitaxial layer,
wherein the additional cap semiconductor epitaxial layer is made of one of SiGe, Ge and GeSn.

18. A method of manufacturing a semiconductor device, the method comprising:
forming fin structures protruding from a first isolation insulating layer disposed over a substrate;

forming a dummy gate structure over upper portions of the fin structures;

after the dummy gate structure is formed, forming a second isolation insulating layer over the first isolation insulating layer;

after the second isolation insulating layer is formed, forming gate sidewall spacers on opposing side faces of the dummy gate structure;

after the gate sidewall spacers are formed, forming trenches by etching source/drain regions of the fin structures;

forming a base semiconductor epitaxial layer in each of the trenches; and forming a cap semiconductor epitaxial layer on the base semiconductor epitaxial layer, the cap semiconductor epitaxial layer having a different lattice constant than the base semiconductor epitaxial layer, wherein:

the base semiconductor epitaxial layer is a merged epitaxial layer coupled to the fin structures, a lattice constant of the cap semiconductor epitaxial layer is smaller than a lattice constant of the base semiconductor epitaxial layer, the fin structures extend in a first direction, the dummy gate structure extends in a second direction crossing the first direction and the source/drain regions are adjacent to the dummy gate structure along the first direction, in plan view, and a surface roughness of the cap semiconductor epitaxial layer formed in each of the trenches along the first direction is smaller than a surface roughness of the base semiconductor epitaxial layer formed in each of the trenches along the first direction.

19. The method of claim 18, wherein:

the base semiconductor epitaxial layer is made of one or more layers of SiGe, Ge and GeSn, and the cap semiconductor epitaxial layer is made of one of SiGe and Ge.

20. The method of claim 19, further comprising:

forming an additional cap semiconductor epitaxial layer having a smaller lattice constant than the cap semiconductor epitaxial layer on the cap semiconductor epitaxial layer, wherein the additional cap semiconductor epitaxial layer is made of one of Si and SiGe.

* * * * *